United States Patent
Maruyama et al.

(10) Patent No.: US 7,337,414 B2
(45) Date of Patent: Feb. 26, 2008

(54) LOGICAL EQUIVALENCE VERIFYING DEVICE, METHOD, AND COMPUTER-READABLE MEDIUM THEREOF

(75) Inventors: Terunobu Maruyama, Kawasaki (JP); Hiroji Takeyama, Kawasaki (JP); Takeo Nakamura, Kawasaki (JP); Mitsuru Satou, Kawasaki (JP); Yuki Kumon, Kawasaki (JP); Miki Takagi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 99 days.

(21) Appl. No.: 11/398,609

(22) Filed: Apr. 6, 2006

(65) Prior Publication Data

US 2006/0184903 A1    Aug. 17, 2006

Related U.S. Application Data

(62) Division of application No. 10/705,787, filed on Nov. 12, 2003, now Pat. No. 7,143,375.

(30) Foreign Application Priority Data

Nov. 15, 2002 (JP) .............................. 2002-331756
Jul. 24, 2003 (JP) .............................. 2003-201144

(51) Int. Cl.
*G06F 17/50* (2006.01)
(52) U.S. Cl. ................... 716/3; 716/4; 716/5
(58) Field of Classification Search ............ 716/3, 716/4, 5
See application file for complete search history.

(56) References Cited

U.S. PATENT DOCUMENTS 6,449,750 B1    9/2002    Tsuchiya

FOREIGN PATENT DOCUMENTS

| JP | 03-157781 | 7/1991 |
|---|---|---|
| JP | 04-140885 | 5/1992 |
| JP | 05-006403 | 1/1993 |
| JP | 05-225274 | 9/1993 |
| JP | 06-223130 | 8/1994 |
| JP | 07-085112 | 3/1995 |
| JP | 08-190421 | 7/1996 |
| JP | 09-044552 | 2/1997 |
| JP | 10-254923 | 9/1998 |
| JP | 2000-207440 | 7/2000 |
| JP | 2001-060216 | 3/2001 |

*Primary Examiner*—Sun James Lin
(74) *Attorney, Agent, or Firm*—Staas & Halsey LLP

(57) ABSTRACT

The time and trouble of a mismatch cause analysis after logical equivalence verification can be reduced, and design and verification TAT can be shortened. A logical equivalence verifying device performs logical equivalence verification between two circuits, and displays the result of the logical equivalence verification. A preprocessing section 7 performs structural matching so as to determine whether there are portions corresponding in circuit structure to each other in corresponding logic cones of the two circuits. An internal DB 5 records the results of the structural matching as an identifier for each element. A subcone extracting section 8 extracts, as a subcone, a collection of elements, which are mutually to one another and have the same identifier, from each logic cone. A verifying section 9 performs logical equivalence verification between the two circuits for each of the extracted subcones. A display control section 10 displays only those subcones for which the logical equivalence verification has resulted in mismatch.

17 Claims, 14 Drawing Sheets

SPECIFICATION   IMPLEMENTATION

UNMATCHED INTERNAL VERIFICATION POINTS

SPECIFICATION

IMPLEMENTATION

SPECIFICATION

IMPLEMENTATION

FIG. 8
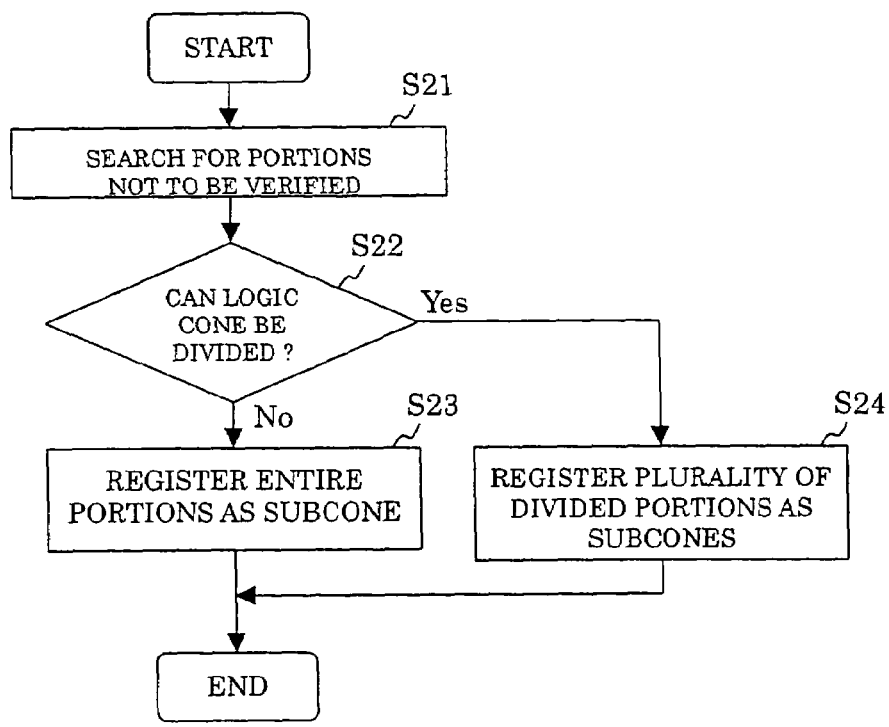
FIG. 9A
SPECIFICATION
FIG. 9B
IMPLEMENTATION
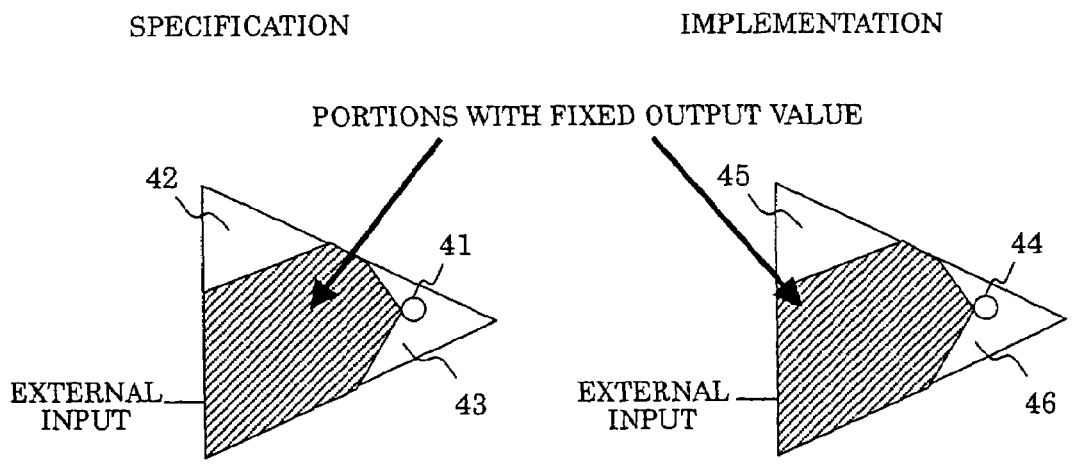

| | LOGIC MISMATCH LIST | | |
|---|---|---|---|
| 1 | SPECIFICATION | S | ■ |
| | IMPLEMENTATION | S | |
| 2 | SPECIFICATION | T | ■ |
| | IMPLEMENTATION | T | |
| 3 | SPECIFICATION | U | ■ |
| | IMPLEMENTATION | U | |
| 4 | SPECIFICATION | V | ■ |
| | IMPLEMENTATION | V | |
| 5 | SPECIFICATION | | □ |
| | IMPLEMENTATION | | |
| 6 | SPECIFICATION | | □ |
| | IMPLEMENTATION | | |

ANALYSIS CONDITION SETTING ~71

FIG. 16

ANALYSIS CONDITION SETTING

ANALYSIS ELEMENT KINDS

| | | | | | |
|---|---|---|---|---|---|
| AND | ■ON | □OFF | ADDER | □ON | ■OFF |
| OR | ■ON | □OFF | 3STATE | □ON | ■OFF |
| EOR | □ON | ■OFF | WIRED LOGIC | □ON | ■OFF |
| NAND | □ON | ■OFF | INVERTER | □ON | ■OFF |
| NOR | □ON | ■OFF | BUFFER | □ON | ■OFF |
| ENOR | □ON | ■OFF | | | |
| AND · OR COMBINATION | □ON | ■OFF | | | |
| SELECTOR | □ON | ■OFF | | | |

ANALYSIS ELEMENT CONNECTION STATUS

| | |
|---|---|
| MINIMUM INPUT NUMBER | 2 |
| MAXIMUM INPUT NUMBER | NO LIMIT |
| MINIMUM OUTPUT BRANCH NUMBER | NO LIMIT |
| MAXIMUM OUTPUT BRANCH NUMBER | NO LIMIT |

NUMBER OF OCCURRENCES

EQUAL TO OR MORE THAN  1

72

ANALYSIS EXECUTION

FIG.17

COMMON MISMATCH CAUSE ANALYSIS RESULTS

| SPECIFICATIONS | S | T | U | V | | | APPLICABLE NUMBER |
|---|---|---|---|---|---|---|---|
| L1 | ■ | ■ | ■ | ■ | | | 4 |
| L2 | ■ | ■ | ■ | ■ | | | 4 |
| L3 | | | ■ | ■ | | | 2 |
| L4 | ■ | ■ | ■ | | | | 3 |
| L5 | | | ■ | ■ | | | 2 |
| L6 | ■ | ■ | | ■ | | | 3 |
| L7 | ■ | | | | | | 1 |
| L8 | | ■ | | | | | 1 |
| L9 | | | ■ | | | | 1 |
| L10 | | | | ■ | | | 1 |

| IMPLEMENTATION | S | T | U | V | | | APPLICABLE NUMBER |
|---|---|---|---|---|---|---|---|
| M1 | ■ | ■ | ■ | ■ | | | 4 |
| M2 | ■ | ■ | ■ | ■ | | | 4 |
| M3 | | | ■ | ■ | | | 2 |
| M4 | ■ | ■ | ■ | | | | 3 |
| M5 | | | ■ | ■ | | | 2 |
| M6 | ■ | ■ | | ■ | | | 3 |
| M7 | ■ | | | | | | 1 |
| M8 | | ■ | | | | | 1 |
| M9 | | | ■ | | | | 1 |
| M10 | | | | ■ | | | 1 |

# LOGICAL EQUIVALENCE VERIFYING DEVICE, METHOD, AND COMPUTER-READABLE MEDIUM THEREOF

This is a Divisional Application of application Ser No. 10/705,787 filed Nov. 12, 2003, now U.S. Pat. No. 7,143,375.

BACKGROUND OF THE INVENTION

1. Field of the Invention

The present invention relates to a logical equivalence verifying device, a logical equivalence verifying method and a logical equivalence verifying program in which after logical equivalence between a pre-change one and a post-change one of a circuit being designed is verified when the circuit has been changed or altered, only those portions in which there is a difference or mismatch between the logic of the pre-change circuit and the logic of the post-change circuit are displayed, and in addition, when a large number of locations where logical mismatches are detected, the causes of common mismatches, which are elements of the causes of common logical mismatches between the pre-change circuit and the post-change circuit, are analyzed.

2. Description of the Related Art

A logical equivalence verifying technology for verifying logic designs of large-scale integrated (LSI) circuits or the like is one of computer-aided design (CAD) technologies, and the development of LSI circuits includes a multitude of processes, starting from specification study until final LSI manufacture. As a result, it is very important that errors or mistakes in logic designs should not come in during a design process in order to develop LSI circuits of high quality.

After a logic specification has been fixed in the design process, changes in the actual configuration of a logic circuit, such as insertion of a scan circuit for signal timing adjustments, manufacturing tests, etc., are frequently carried out in implementation design processes for actual manufacture without altering the logic specification. Such work is called an implementation process, in which there is a high possibility of errors or mistakes being introduced therein to change the logic. Therefore, it is necessary to improve the quality of the logic design by verifying whether the logic specifications of the logic circuits before and after the implementation match or coincide with each other. The technology for this purpose is a logical equivalence verification technology. Hereinafter, the logic circuit before the implementation process is called "specification", and the logic circuit after the implementation process is called "implementation".

First of all, a plurality of verification points are selected in the logic circuit before logical equivalence verification is performed. For the verification points, those points at which the circuit can be easily cut, such as external terminals, flip-flops (FF) or the like of an LSI circuit, are usually selected. Then, a portion of the circuit having a certain verification point as an output point is extracted as a logic cone. Here, note that the logic cone is a portion of the circuit backtraced or backtracked from the verification point extracted as the output point to other verification points which become input points.

FIG. 23 is a view showing one example of such a logic cone. As shown in FIG. 23, a logic cone 51 is a portion backtraced from a verification point 52, which serves as an output point, to verification points 53, 54, which serve as input points. In addition, the verification points 53, 54 are also output points of other logic cones. Though each logic cone is usually not so large, several thousand to several ten or hundred thousand logic cones are cut out from a single LSI circuit, so that logical equivalence verification for each logic cone is performed. When the logics of all the logic cones become matched or in coincidence, the two logic circuits, i.e., an implementation and a specification, are finally considered to be equivalent to each other, whereas when they become mismatched or out of coincidence, the logics of a plurality of logic cones often become mismatched, so analysis also becomes difficult. For instance, when the logic cone 51 and the logic cone 55 overlap with each other, as shown in FIG. 23, it is verified that both the logic cones 51, 55 do not match each other if design errors or mistakes are induced into the overlapping portions thereof.

Though the logic of the specification and the logic of the implementation are expected to coincide with each other, if the verification results become mismatched due to correction mistakes or the like, it is necessary to analyze its causes and correct the logic in an appropriate manner.

Also, for a logical equivalence verifying device which performs logical equivalence verification between a pre-change circuit and a post-change circuit and displays the results thereof, there is known one which displays non-coincident or mismatched portions when there exists a difference or mismatch between the logic of the pre-change circuit and the logic of the post-change circuit (for example, see a first patent document: Japanese Patent Application Laid-Open No 10-254923, pages 3, 4 and FIG. 1).

However, there arises a problem that the number of logic cones constituting one LSI circuit is huge, as mentioned above, so it requires a lot of time and trouble to specify the cause of mismatches after the logical equivalence verification. Moreover, the user selects sets of corresponding portions of the specification and the implementations in a plurality of logic cones which become mismatched after the logical equivalence verification, and examines differences between the specification and the implementation on their circuit diagrams so as to find the causes of mismatches, but he or she does not know that it is efficient from which of the mismatch causes the examination is started, thus resulting in quite a lot of number of investigations for the causes of mismatches.

SUMMARY OF THE INVENTION

The present invention has been made in view of the above-mentioned circumstances, and has for its object to provide a logical equivalence verifying device, a logical equivalence verifying method and a logical equivalence verifying program which are capable of reducing the time and trouble of mismatch cause analysis after logical equivalence verification thereby to shorten the design and verification TAT (turn-around time).

Bering the above object in mind, according to a first aspect of the present invention, there is provide a logical equivalence verifying device for performing logical equivalence verification of two prescribed circuits to display the results thereof, the device comprising: a first identifier recording section that performs structural matching in which it is determined whether there are those portions in corresponding logic cones of the two circuits which correspond in circuit structure to each other, and records each result of the structural matching as an identifier for each element; a subcone extracting section that extracts a plurality of collections of elements as subcones from each of the logic cones, each element collection including elements which are connected with each other and have the same identifier; a verifying section that verifies logical equivalence between the two circuits for each subcone extracted by the subcone extracting section; and a display control section that displays a first group of subcones with mismatched results of the logical equivalence verification and a second group of subcones with matched results of the logical equivalence verification while distinguishing between these first and second groups of subcones based on the results of the logical equivalence verification.

According to this configuration, the subcones can be easily extracted by using the results of the structural matching performed before the logical equivalence verification of the two circuits. In addition, logically matched subcones and logically mismatched subcones can be displayed in a mutually distinguishable manner after the logical equivalence verification of the two circuits, whereby the time and trouble of analyzing the causes of mismatches can be reduced, and the design time can be shortened. Here, note that the first identifier recording section in one embodiment of the present invention comprises an internal DB 5 and a preprocessing section 7.

According to a second aspect of the present invention, there is provided a logical equivalence verifying device for performing logical equivalence verification of two prescribed circuits to display the results thereof, the device comprising: a second identifier recording section that performs instance name matching for each element in which it is determined whether instance names of elements in corresponding logic cones of the two circuits match each other, and records the results of the instance name matching as identifiers, respectively; a subcone extracting section that extracts a plurality of element collections as subcones from each of the logic cones, each element collection including elements which are connected with each other and have the same identifier; a verifying section that verifies logical equivalence between the two circuits for each subcone extracted by the subcone extracting section; and a display control section that displays a first group of subcones with mismatched results of the logical equivalence verification and a second group of subcones with matched results of the logical equivalence verification while distinguishing between these first and second groups of subcones based on the results of the logical equivalence verification.

According to this configuration, the subcones can be easily extracted by using the results of the instance name matching performed before the logical equivalence verification of the two circuits. In addition, logically matched subcones and logically mismatched subcones can be displayed in a mutually distinguishable manner after the logical equivalence verification of the two circuits, whereby, the time and trouble of analyzing the causes of mismatches can be reduced, and the design time can be shortened. Here, note that the second identifier recording section in another embodiment of the present invention comprises an internal DB 5 and a preprocessing section 7.

According to a third aspect of the present invention, there is provided a logical equivalence verifying device for performing logical equivalence verification of two prescribed circuits to display the results thereof, the device comprising: a subcone extracting section that extracts subcones from corresponding logic cones of the two circuits by excluding prescribed portions of the logic cones by providing an external input to each of the prescribed portions to make their output to be at a constant value; a verifying section that verifies logical equivalence between the two circuits for each subcone extracted by the subcone extracting section; and a display control section that displays a first group of subcones with mismatched results of the logical equivalence verification and a second group of subcones with matched results of the logical equivalence verification while distinguishing between these first and second groups of subcones based on the results of the logical equivalence verification.

Preferably, in the logical equivalence verifying device according to the third aspect of the present invention, when the logic cone is divided into a plurality of portions by the prescribed portions, the subcone extracting section extracts the plurality of portions as subcones.

According to such a configuration, it is possible to easily extract the subcones by excluding portions not to be verified of the logic cone, such as a test circuit, etc., before the logical equivalence verification of the two circuits. In addition, after the logical equivalence verification of the two circuits, the portions not to be verified are not displayed, and logically matched subcones and logically mismatched subcones can be displayed in a mutually distinguishable manner, whereby the time and trouble of analyzing the causes of mismatches can be reduced, and the design time can be shortened.

According to a fourth aspect of the present invention, there is provided a logical equivalence verifying device for performing logical equivalence verification of two prescribed circuits to display the results thereof, the device comprising: an internal verification point associating section that selects internal verification points in corresponding logic cones of the two circuits, respectively, to observe outputs of portions thereof, and associates the internal verification points of one of the circuits with those of the other circuit; a subcone extracting section that extracts subcones from the logic cones by using the internal verification points; a verifying section that verifies logical equivalence between the two circuits for each subcone extracted by the subcone extracting section; and a display control section that displays a first group of subcones with mismatched results of the logical equivalence verification and a second group of subcones with matched results of the logical equivalence verification while distinguishing between these first and second groups of subcones based on the results of the logical equivalence verification.

According to this configuration, the subcones can be easily extracted by using internal verification points set before the logical equivalence verification of the two circuits. In addition, logically matched subcones and logically mismatched subcones can be displayed in a mutually distinguishable manner after the logical equivalence verification of the two circuits, whereby the time and trouble of analyzing the causes of mismatches can be reduced, and the design time can be shortened. Here, note that the internal verification point associating section in one embodiment of the present invention comprises a preprocessing section 7.

Preferably, in the logical equivalence verifying device according to the fourth aspect of the present invention, the display control section displays, based on the results of the logical equivalence verification, only those subcones for which the logical equivalence verification has resulted in mismatch.

According to this configuration, after the logical equivalence verification of the two circuits, only logically mismatched subcones are displayed, whereby the time and trouble of analyzing the causes of mismatches can be reduced, and the design time can be shortened.

According to a fifth aspect of the present invention, there is provided a logical equivalence verifying device for analyzing causes of logical mismatch when a plurality of mismatched logic cones are detected which are logically mismatched logic cones as a result of logical equivalence verification between two prescribed circuits, the device comprising: a storage section that stores elements constituting the mismatched logic cones; an analyzing section that extracts, as analysis elements among the mismatched logic cones, those elements which constitute logic cones that have been selected as objects for analysis, further extracts, as pertinent logic cones, the mismatched logic cones including the analysis elements for each of the analysis elements, and calculates the number of the pertinent logic cones as a pertinent number for each of the analysis elements; and a display control section that displays the pertinent number for each of the analysis elements.

According to this configuration, by inspecting a pertinent number of each analytical elements, the user can determine that analysis elements with larger pertinent numbers have a high possibility of being common causes of logical mismatches between the two circuits. Here, note that the storage part in one embodiment of the present invention comprises a DB 101.

Preferably, in the logical equivalence verifying device according to the fifth aspect of the present invention, the display control section displays only those of the analysis elements for which the pertinent number is within a prescribed range.

According to this configuration, by inspecting only analysis elements for which their pertinent numbers are each within a prescribed range, the user can narrow analysis elements having a high possibility of being common causes of logical mismatches between the two circuits.

Preferably, in the logical equivalence verifying device according to the fifth aspect of the present invention, the display control section further displays the identifier of a pertinent logic cone for each of the analysis elements.

According to this configuration, by inspecting a pertinent logic cone and a pertinent number for each of the analysis elements, the user can know analysis elements with a high possibility of being the common cause of logical mismatches between the two circuits and a logic cone including those analysis elements.

Preferably, in the logical equivalence verifying device according to the fifth aspect of the present invention, the display control section highlights those output points which are subject to influences due to the correction of elements.

According to this configuration, the user can reduce needless circuit changes and reverifications by displaying the influence of the correction of elements upon logically mismatched logic cones in the logical equivalence verification.

Preferably, in the logical equivalence verifying device according to the fifth aspect of the present invention, the display control section highlights those output points which are subject to influences due to a constraint of an input for excluding a prescribed portion not to be verified.

According to this configuration, the user can reduce needless circuit changes and reverifications by displaying the influence of the constraint of the input upon logically mismatched logic cones in the logical equivalence verification.

Preferably, in the logical equivalence verifying device according to the fifth aspect of the present invention, the two prescribed circuits comprise a pre-change one and a post-change one of a circuit being designed when the circuit is changed.

According to this configuration, after the logical equivalence verification of the pre-change circuit and the post-change circuit, only logically mismatched subcones are displayed, whereby the time and trouble of analyzing the causes of mismatches can be reduced, and the design time can be shortened.

According to a sixth aspect of the present invention, there is provided a logical equivalence verifying method for performing logical equivalence verification of two prescribed circuits to display the results thereof, the method comprising: a step for performing structural matching in which it is determined whether there are those portions in corresponding logic cones of the two circuits which correspond in circuit structure to each other, and recording the results of the structural matching as an identifier for each element; a step for extracting a plurality of element collections as subcones from each of the logic cones, each element collection including elements which are connected with each other and have the same identifier; a step for performing logical equivalence verification between the two circuits for each of the subcones; and a step for displaying a first group of subcones with mismatched results of the logical equivalence verification and a second group of subcones with matched results of the logical equivalence verification while distinguishing between these first and second groups of subcones based on the results of the logical equivalence verification.

According to a seventh aspect of the present invention, there is provided a logical equivalence verifying method for performing logical equivalence verification of two prescribed circuits to display the results thereof, the device comprising: a step for performing instance name matching for each element in which it is determined whether instance names of elements in corresponding logic cones of the two circuits match each other, and recording the results of the instance name matching as identifiers, respectively; a step for extracting a plurality of element collections as subcones from each of the logic cones, each element collection including elements which are connected with each other and have the same identifier; a step for performing logical equivalence verification between the two circuits for each of the subcones; and a step for displaying a first group of subcones with mismatched results of the logical equivalence verification and a second group of subcones with matched results of the logical equivalence verification while distinguishing between these first and second groups of subcones based on the results of the logical equivalence verification.

According to an eighth aspect of the present invention, there is provided a logical equivalence verifying method for performing logical equivalence verification of two prescribed circuits to display the results thereof, the method comprising: a step for extracting subcones from corresponding logic cones of the two circuits by excluding prescribed portions of the logic cones by providing an external input to each of the prescribed portions to make their output to be at a constant value; a step for performing logical equivalence verification between the two circuits for each of the subcones; and a step for displaying a first group of subcones with mismatched results of the logical equivalence verification and a second group of subcones with matched results of the logical equivalence verification while distinguishing between these first and second groups of subcones based on the results of the logical equivalence verification.

According to a ninth aspect of the present invention, there is provided a logical equivalence verifying method for performing logical equivalence verification of two prescribed circuits to display the results thereof, the method comprising: a step for selecting internal verification points in corresponding logic cones of the two circuits, respectively, to observe outputs of portions thereof, and associating the internal verification points of one of the circuits with those of the other circuit; a step for extracting subcones from the logic cones by using the internal verification points; a step for performing logical equivalence verification between the two circuits for each of the subcones; and a step for displaying a first group of subcones with mismatched results of the logical equivalence verification and a second group of subcones with matched results of the logical equivalence verification while distinguishing between these first and second groups of subcones based on the results of the logical equivalence verification.

According to a tenth aspect of the present invention, there is provided a logical equivalence verifying method for analyzing causes of logical mismatch when a plurality of mismatched logic cones are detected which are logically mismatched logic cones as a result of logical equivalence verification between two prescribed circuits, the method comprising: a step for storing elements constituting the mismatched logic cones; a step for extracting, as analysis elements among the mismatched logic cones, those elements which constitute logic cones that have been selected as objects for analysis, further extracting, as pertinent logic cones, the mismatched logic cones including the analysis elements for each of the analysis elements, and calculating the number of the pertinent logic cones as a pertinent number for each of the analysis elements; and a step for displaying the pertinent number for each of the analysis elements.

According to an eleventh aspect of the present invention, there is provided a logical equivalence verifying program for making a computer execute a logical equivalence verifying method which performs logical equivalence verification of two prescribed circuits to display the results thereof, the program adapted to make the computer execute the steps of: performing structural matching in which it is determined whether there are those portions in corresponding logic cones of the two circuits which correspond in circuit structure to each other, and recording the results of the structural matching as an identifier for each element; extracting a plurality of element collections as subcones from each of the logic cones, each element collection including elements which are connected with each other and have the same identifier; performing logical equivalence verification between the two circuits for each of the subcones; and displaying a first group of subcones with mismatched results of the logical equivalence verification and a second group of subcones with matched results of the logical equivalence verification while distinguishing between these first and second groups of subcones based on the results of the logical equivalence verification.

According to a twelfth aspect of the present invention, there is provided a logical equivalence verifying program for making a computer execute a logical equivalence verifying method which performs logical equivalence verification of two prescribed circuits to display the results thereof, the program adapted to make the computer execute the steps of: performing instance name matching for each element in which it is determined whether instance names of elements in corresponding logic cones of the two circuits match each other, and recording the results of the instance name matching as identifiers, respectively; extracting a plurality of element collections as subcones from each of the logic cones, each element collection including elements which are connected with each other and have the same identifier; performing logical equivalence verification between the two circuits for each of the subcones; and displaying a first group of subcones with mismatched results of the logical equivalence verification and a second group of subcones with matched results of the logical equivalence verification while distinguishing between these first and second groups of subcones based on the results of the logical equivalence verification.

According to a thirteenth aspect of the present invention, there is provided a logical equivalence verifying program for making a computer execute a logical equivalence verifying method which performs logical equivalence verification of two prescribed circuits to display the results thereof, the program adapted to make the computer execute the steps of: extracting subcones from corresponding logic cones of the two circuits by excluding prescribed portions of the logic cones by providing an external input to each of the prescribed portions to make their output to be at a constant value; performing logical equivalence verification between the two circuits for each of the subcones; and displaying a first group of subcones with mismatched results of the logical equivalence verification and a second group of subcones with matched results of the logical equivalence verification while distinguishing. between these first and second groups of subcones based on the results of the logical equivalence verification.

According to a fourteenth aspect of the present invention, there is provided a logical equivalence verifying program for making a computer execute a logical equivalence verifying method which performs logical equivalence verification of two prescribed circuits to display the results thereof, the program adapted to make the computer execute the steps of: selecting internal verification points in corresponding logic cones of the two circuits, respectively, to observe outputs of portions thereof, and associating the internal verification points of one of the circuits with those of the other circuit; extracting subcones from the logic cones by using the internal verification points; performing logical equivalence verification between the two circuits for each of the subcones; and displaying a first group of subcones with mismatched results of the logical equivalence verification and a second group of subcones with matched results of the logical equivalence verification while distinguishing between these first and second groups of subcones based on the results of the logical equivalence verification.

According to a fifteenth aspect of the present invention, there is provided a logical equivalence verifying program for making a computer execute a logical equivalence verifying method for analyzing causes of logical mismatch when a plurality of mismatched logic cones are detected which are logically mismatched logic cones as a result of logical equivalence verification between two prescribed circuits, the program adapted to make the computer execute the steps of: storing elements constituting the mismatched logic cones; extracting, as analysis elements among the mismatched logic cones, those elements which constitute logic cones that have been selected as objects for analysis, further extracting, as pertinent logic cones, the mismatched logic cones including the analysis elements for each of the analysis elements, and calculating the number of the pertinent logic cones as a pertinent number for each of the analysis elements; and displaying the pertinent number for each of the analysis elements.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIG. 8 is a block diagram showing one example of a subcone extracting process according to the fourth embodiment of the present invention.

FIGS. 9A and 9B are views showing examples of subcones extracted from the specification and the implementation, respectively, excluding portions not to be verified.

FIG. 16 is a view showing one example of an analysis condition setting screen.

FIG. 17 is a view showing one example of a common mismatch cause analysis result screen.

DESCRIPTION OF THE PREFERRED EMBODIMENTS

Hereinafter, preferred embodiments of the present invention will be described in detail while referring to the accompanying drawings.

Embodiment 1

In this embodiment, portions in a logic cone are extracted as subcones by using a plurality of internal verification points set in the logic cone before logical equivalence verification, so that each of the subcones is verified, and subcones with mismatched verification results alone are displayed.

Figure 1:
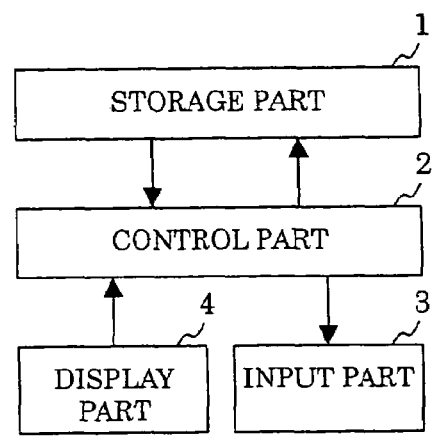
FIG. 1 is a block diagram showing one example of the configuration of a logical equivalence verifying device according to an embodiment of the present invention.

First of all, reference will be made to the configuration of a logical equivalence verifying device according to the present invention. FIG. 1 is a block diagram that shows one example of the schematic configuration of the logical equivalence verifying device. As shown in FIG. 1, the logical equivalence verifying device includes a storage part 1, a control part 2, a display part 3 and an input part 4. The storage part 1 stores data bases (DBs) such as a circuit information data base, a verification control program, etc., and the control part 2 performs a display on the display part 3 in accordance with the verification control program in the storage part 1 and an instruction from the input section 4. The user instructs an input and a change of a circuit, logical equivalence verification, etc., by using the input section 4.

Figure 2:
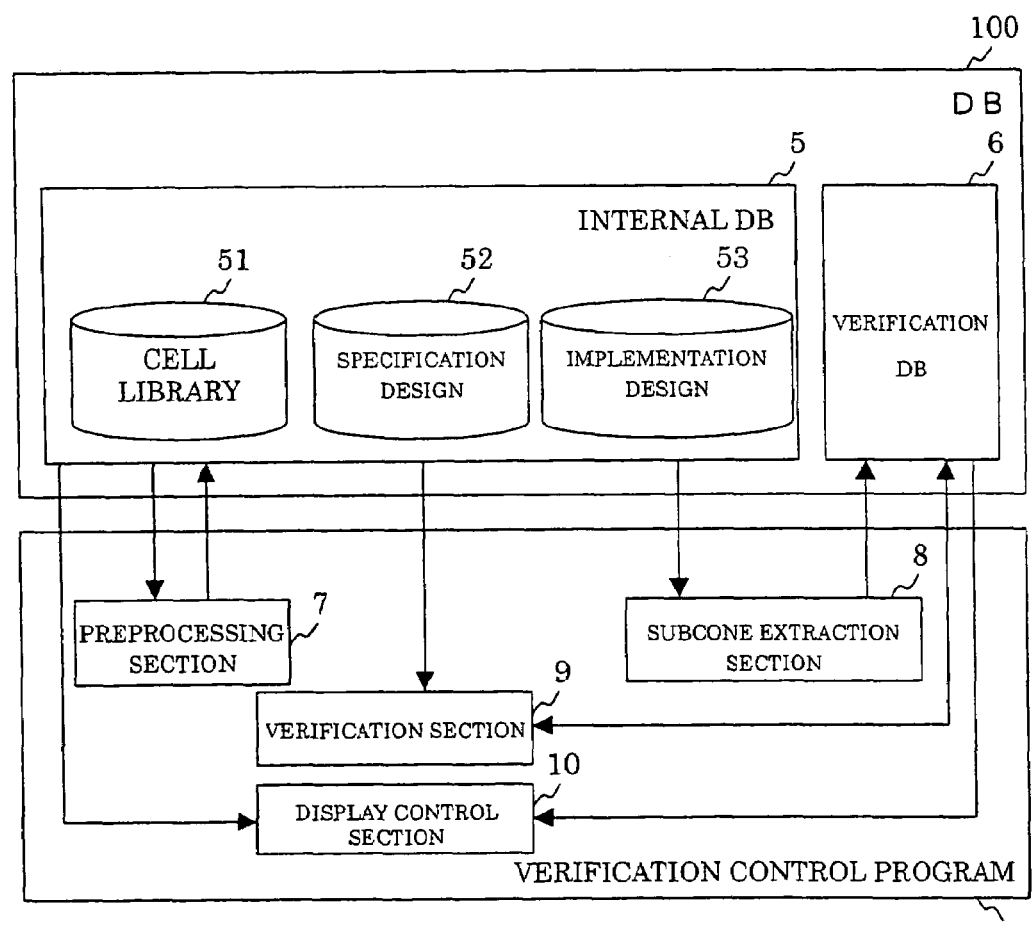
FIG. 2 is a functional block diagram of one example of the function of each of logical equivalence verifying devices according to a first through a fourth embodiment of the present invention.

Next, the function of the logical equivalence verifying device will be described below. FIG. 2 is a functional block diagram that shows one example of the function of the logical equivalence verifying device. As shown in FIG. 2, the function of the logical equivalence verifying device includes a date base (DB) 100 and a verification control program 200. The DB 100 includes an internal DB 5 for recording information on the circuit and a verification DB 6 for recording information on logical equivalence verification. The internal DB 5 includes a cell library 51, a specification design 52 and an implementation design 53. The cell library 51 records cell names, circuit information on cells, etc. For instance, cell names are represented by AND2 (AND with two inputs), AND3 (AND with three inputs), etc. The specification design 52 records instance information, cell names, circuit connection information, etc., in the specification. The instance information is information comprising instance names and instance terminal names. Instance names are names applied to individual elements, respectively. Similarly, an implementation design 13 records the instance information, the cell names, the circuit connection information, etc., in the implementation. The verification DB 6 records information on the subcones and verification information in the form of the verification result for each subcone as a verification table.

Figure 3:
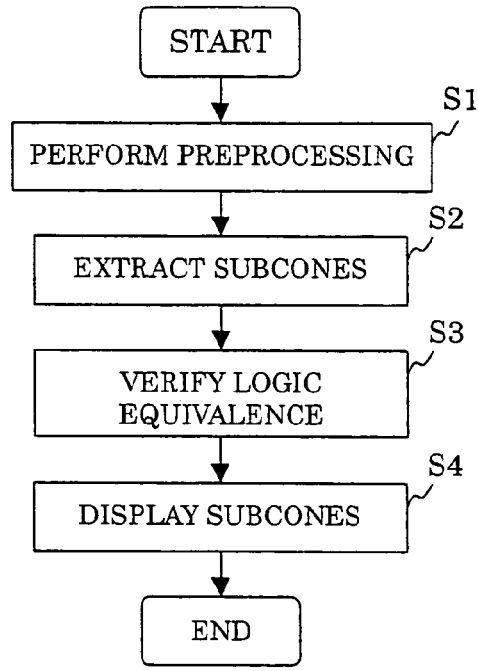
FIG. 3 is a flow chart showing one example of the processing of a verification control program according to the present invention.

In addition, the verification control program 200 includes a preprocessing section 7, a subcone extracting section 8, a verifying section 9 and a display control section 10, as shown in FIG. 2. FIG. 3 is a flow chart that shows one example of the flow of the verification control program.

First of all, the preprocessing section 7 performs preprocessing for the logical equivalence verification by using information on circuits in the internal DB 5 (S1). The preprocessing section 7 first performs the association of hierarchical instances between the specification and the implementation. Here, the association is made by using hierarchical instance names for example. Then, verification points in the specification and the implementation are selected and associated with each other. In addition, those portions of the specification and the implementation which have the verification points as output points are extracted as logic cones. Thereafter, the preprocessing section 7 selects and associates internal verification points in the logic cones in the specification and the implementation. The internal verification points are points to observe partial outputs in the logic cones.

Subsequently, the subcone extracting section 8 extracts subcones from logic cones by using a plurality of internal verification points, and records information on the extracted subcones in a verification table of the verification DB 6 (S2). A subcone in this embodiment is a portion backtraced from an internal verification point acting as an output point to other internal verification points acting as input points.

Then, the verifying section 9 performs the logical equivalence verification of corresponding subcones in the specification and the implementation (S3) one by one, and records the results thereof as verification information for each subcone in a verification table of the verification DB 6. For instance, verification information includes information such as "mismatched", "unverified", and "matched".

Moreover, in this embodiment, when the internal verification points of a first subcone, which are input points thereof, with their verification information becoming matched, are internal verification points of a second subcone, which are output points, with their verification information becoming matched, these internal verification points are not held and the verification table of the verification DB 6 is updated with the first subcone and the second subcone being made as one subcone. This process is continuously carried out for all the subcones of the logic cone.

Then, the display control section 10 reads information on the circuits of the specification and the implementation from the internal DB 5 in accordance with the updated verification information in the verification table of the verification DB 6, and displays only those subcones for which logical mismatches between the circuit diagram of the specification and the circuit diagram of the implementation at the display part 3 (S4). Here, note that the subcones with "matched" verification information are not displayed, and the subcones with "mismatched" or "unverified" verification information are displayed.

Figures 4A, 4B:
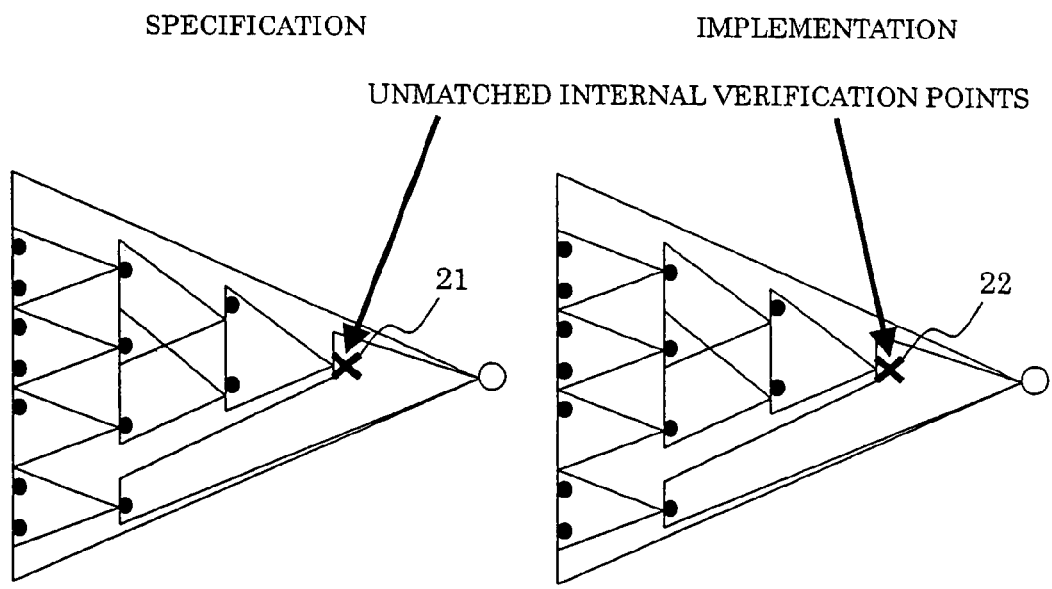
FIGS. 4A and 4B are views showing examples of subcones extracted from a specification and an implementation, respectively, of a circuit being designed by using internal verification points.

FIGS. 4A and 4B are views that show one example of a subcone extracted by the use of internal verification points. FIG. 4A shows a logic cone in the specification, and FIG. 4B shows a logic cone in the implementation, these two logic cones being corresponding to each other. In addition, white circles indicate verification points, and filled circles indicate internal verification points.

In the logic cone of FIG. 4A, since verification information on a subcone with an internal verification point 21 as an output point becomes "mismatched", that subcone is displayed. Similarly, in the logic cone of FIG. 4B, verification information on a subcone with an internal verification point 22 as an output point becomes "mismatched", so that subcone is displayed. For subcones with other internal verification points as output points, whether they are to be displayed is determined based on their verification information.

Embodiment 2

In this second embodiment, portions in a logic cone are extracted as subcones by using the results of structural matching automatically executed before logical equivalence verification, and each subcone is verified so that only the subcones with mismatched results are displayed.

Though in this embodiment, too, logical equivalence verification is carried out in accordance with a flow shown in FIG. 3 by using the logical equivalence verifying device illustrated in FIG. 1, the preprocessing and the subcone extraction processing in this embodiment are different from those in the first embodiment. Hereinafter, reference will be made to the preprocessing and the subcone extraction processing in this embodiment.

In this embodiment, the preprocessing section 7 performs structural matching between the corresponding logic cones between the specification and the implementation after extracting, as logic cones, portions of a circuit with verification points as their output points. Here, note that the structural matching is a process for determining whether there are corresponding portions in circuit structure between the specification and the implementation, by making a comparison between instance names, connections between instances, logical expressions, etc., between the specification and the implementation. The subcone extracting section 8 extracts subcones from the logic cone by using the results of the structural matching, and records information on the extracted subcones in the verification table of the verification DB 6 (S2). The processes similar to those of the first embodiment are performed for a logical equivalence verification step (S3) and an subcone indication step (S4).

Next, the subcone extraction processing in this embodiment will be described below. First of all, the result of the structural matching for each instance by the preprocessing section 7 is recorded as an identification flag in the specification design 52 and the implementation design 53, respectively. For example, for instances with mismatched structures, "1" is recorded as an identification flag, whereas for instances with matched structures, "0" is recorded as an identification flag. Thereafter, the subcone extracting section 8 extracts subcones with identification flags recorded in the specification design 52 and the implementation design 53.

Figure 5:
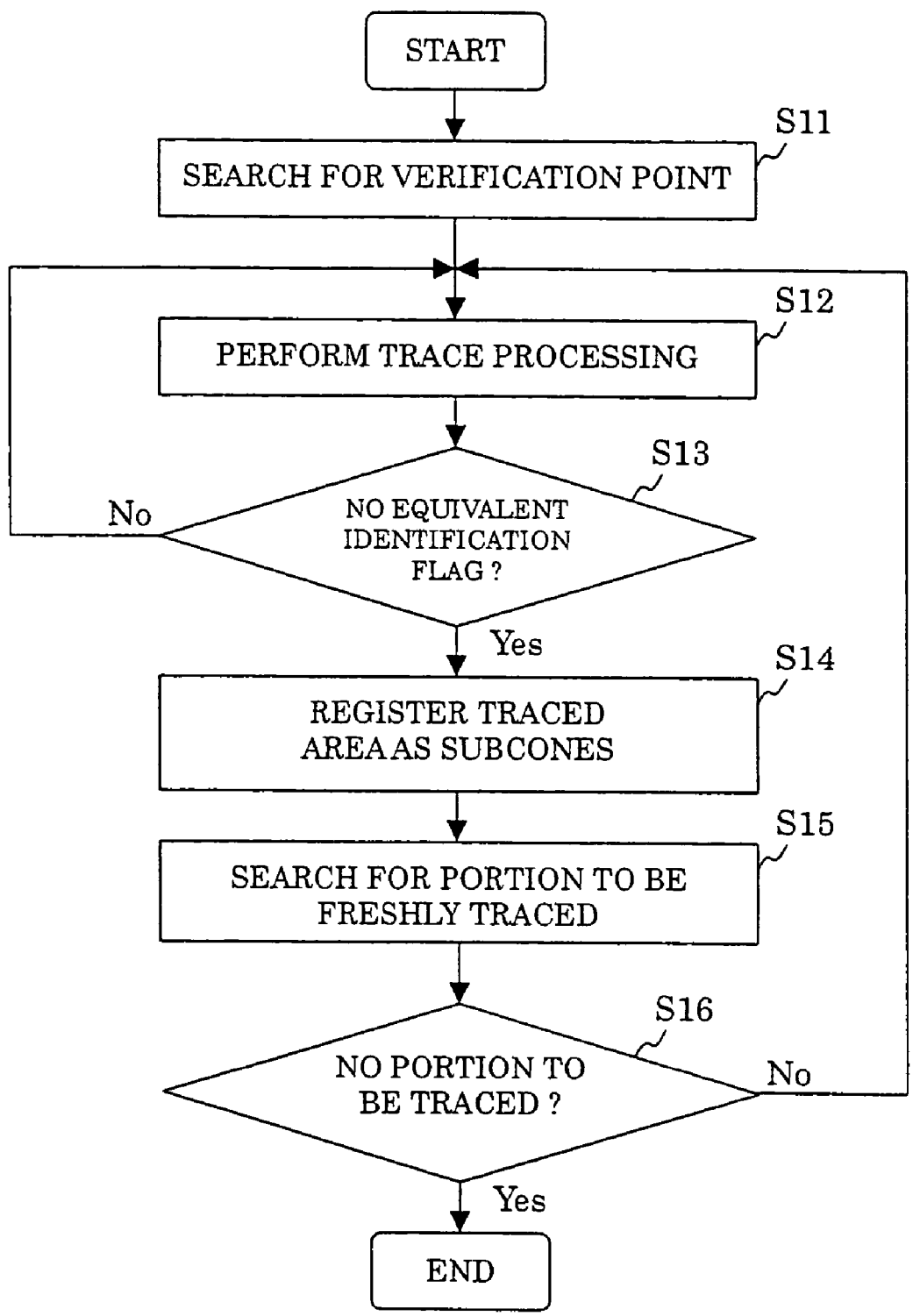
FIG. 5 is a block diagram showing one example of a process of extracting subcones inside a logic cone according to the second and third embodiments of the present invention.

FIG. 5 is a block diagram that shows one example of a process of extracting subcones in the logic cone in the first embodiment. First, a verification point in the form of an output point of the logic cone is searched, and the verification point thus searched is set as a first trace origin (or start point) (S11). Then, trace processing is carried out for searching for instances at trace destinations (or end points) connected to an instance at the trace origin in a direction toward an input point of the logic cone in accordance with connection information between these instances (S12). Thereafter, the identification flag of the instance at the trace origin and the identification flags of the instances at all the trace destinations are compared in the trace processing (S13).

When the identification flag of either one of the instances at the trace destinations is equal to the identification flag of the instance at the trace origin (S13, No) as a result of the comparison of the identification flags, the flow returns to the processing S12 where the trace processing is continued while setting an instance with the equal identification flag as a new trace origin.

On the other hand, the identification flags of the instances at all the trace destinations differ from the identification flag of the trace origin as a result of the identification flag comparison (S13, Yes), the range having been subjected to the trace processing is extracted as a subcone, which is registered in the verification DB 6 (S14). Then, an instance in a new trace origin in the logic cone is searched (S15).

When there still remains any instance in the logic cone, which is likely to be a trace origin and has not yet been subjected to trace processing (S16, No), a return is performed to the processing S12. On the other hand, when there has no longer been left any instance which can be a trace origin (S16, Yes), the flow is ended. All the subcones in the logic cone are extracted in accordance with the above-mentioned flow. This flow is performed for all the logic cones.

Figure 6A:
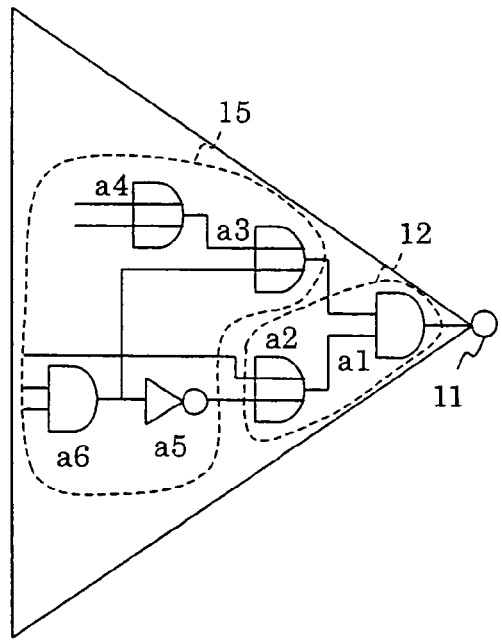
FIGS. 6A and 6B are views showing examples of subcones extracted from the specification and the implementation, respectively, by using the results of structural matching.
Figure 6B:
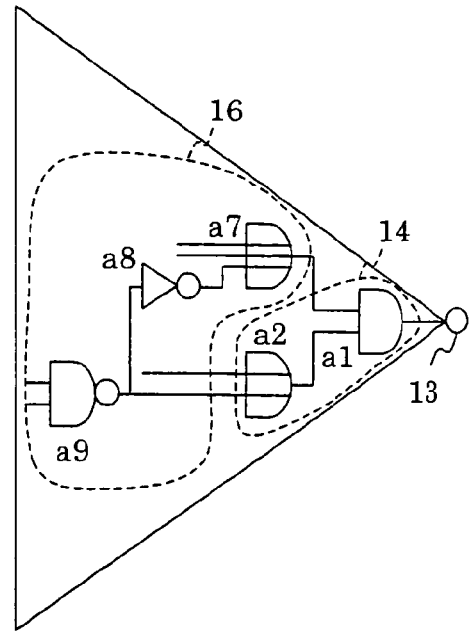

FIGS. 6A and 6B are views that show one example of a subcone extracted by using the result of structural matching. FIG. 6A shows a logic cone in a specification, and FIG. 6B shows a logic cone in an implementation, these two logic cones corresponding to each other. In addition, the portions enclosed by broken lines are subcones extracted from the logic cones in the specification and the implementation, respectively.

In the logic cone of FIG. 6A, trace processing is performed from a verification point 11. That is, first of all, if instance a2 connected to instance a1 has an identification flag equal to that of instance a1, trace processing is performed from a1 to a2, whereas if instance a5 connected to instance a2 has an identification flag different from that of instance a2, trace processing is not performed. Further, if instance a3 connected to instance a1 has an identification flag different from that of instance a1, there remains no instance that is to be subjected to trace processing. As a result, instances a1 and a2 are extracted as a subcone 12.

Subsequently, instance a3 is set as a new trace origin, similar trace processing is started. If instances a4, a5 and a6 connected to instance a3 have their identification flags equal to that of instance a3, trace processing is performed from a3 to a4, a5 and a6. Thus, there remains no instance which can become a trace origin. As a result, instances a3, a4, a5 and a6 are extracted as a subcone 15. Therefore, two subcones 12 and 15 are extracted from the logic cone of FIG. 6A.

Similarly, in the logic cone of FIG. 6B, trace processing is performed from a verification point 13. First of all, if instance a2 connected to instance a1 has an identification flag equal to that of instance a1, trace processing is performed from a1 to a2, whereas if instances a8 and a9 connected to instance a2 has an identification flag different from instance a2, trace processing is not performed. Further, if instance a7 connected to instance a1 has an identification flag different from instance a1, there remains no instance that is to be subjected to trace processing. As a result, instances a1 and a2 are extracted as a subcone 14.

Thereafter, instance a7 is set as a new trace origin, similar trace processing is started. If instance a8 connected to instance a7 has an identification flag equal to that of instance a7, trace processing is first performed from a7 to a8. Then, if instance a9 connected to instance a8 has an identification flag equal to that of instance a8, trace processing is performed from a8 to a9. Thus, there remains no instance which can become a trace origin. As s result, instances a7, a8 and a9 are extracted as a subcone 16. Accordingly, two subcones 14 and 16 are extracted from the logic cone of FIG. 6B.

As described above, a collection of instances, which are mutually connected one another and have an equal identification flag, are extracted as a subcone for each of the specification and the implementation, and corresponding subcones in the specification and the implementation are verified, respectively. In FIG. 6, logical equivalence between the corresponding subcones 12 and 14 is verified, and if, for example, the verification results match or coincide with each other, no display is made. Also, logical equivalence between the corresponding subcones 15 and 16 are verified, and the verification results, if not match each other for example, are displayed. As can be seen from the foregoing, only the subcones with their logic becoming not matched are displayed by the display part 3, whereby the time and trouble in analyzing the cause of mismatches can be reduced, thus making it possible to shorten the design time.

Embodiment 3

In this third embodiment, portions in a logic cone are extracted as subcones by using the results of instance name matching automatically executed before logical equivalence verification, and each subcone is verified so that only the subcones with mismatched results are displayed.

Though in this embodiment, too, logical equivalence verification is carried out in accordance with a flow shown in FIG. 3 by using the logical equivalence verifying device illustrated in FIG. 1, the preprocessing and the subcone extraction processing in this embodiment are different from those in the first embodiment. Hereinafter, reference will be made to the preprocessing and the subcone extraction processing in this embodiment.

In this embodiment, the preprocessing section 7 performs instance name matching between the corresponding logic cones in the specification and the implementation after extracting, as logic cones, portions of a circuit with verification points as their output points. The instance name matching is a process for determining, by comparison instance names between the specification and implementation, whether there are any portions corresponding in instance names. The subcone extracting section 8 extracts subcones from the logic cone by using the results of the instance name matching, and records information on the extracted subcones in the verification table of the verification DB 6 (S2). Here, note that processes similar to those of the first embodiment are performed for a logical equivalence verification step (S3) and an subcone indication step (S4).

Next, the subcone extraction processing in this embodiment will be described below. First of all, the result of the instance name matching for each instance by the preprocessing section 7 is recorded as an identification flag in the specification design 52 and the implementation design 53, respectively.

For example, if a certain instance name of the specification does not match with any instance name of the implementation, an identification flag of that instance in the specification design 52 is recorded as 1, and link information is not recorded. Similarly, if a certain instance name of the implementation does not match with any instance name of the specification, an identification flag for that instance in the implementation design 53 is recorded as 1, and link information is not recorded.

On the other hand, when a certain instance name of the specification matches an instance name of the implementation, an identification flag for that instance in the specification design 52 is recorded as 0, and link information from that instance to the corresponding instance of the implementation is recorded. At the same time, an identification flag for that instance in the implementation design 53 is recorded as 0, and link information from that instance to the corresponding instance of the specification is recorded.

Thereafter, the subcone extracting section 8 extracts subcones by using identification flags recorded in the specification design 52 and the implementation design 53. The subcone extraction processing in this embodiment is performed by a flow similar to that in the flow chart shown in FIG. 5 excluding the use of the identification flags according to the results of the instance name matching. Such subcone extraction processing is performed for all the logic cones.

Figure 7A:
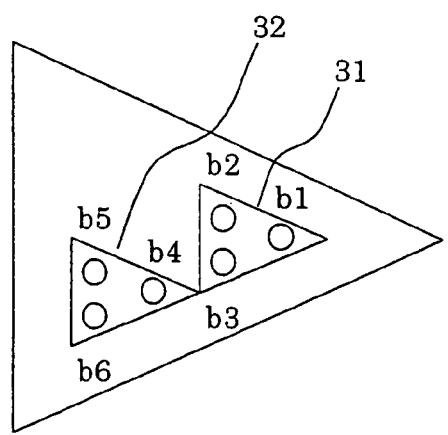
FIGS. 7A and 7B are views showing examples of subcones extracted from the specification and the implementation, respectively, by using the results of instance name matching.
Figure 7B:
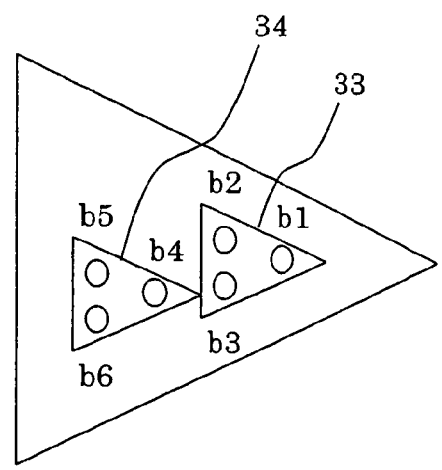

FIGS. 7A and 7B are views that show one example of subcones extracted by using the results of the instance name matching. FIG. 7A shows a logic cone in the specification, and FIG. 7B shows a logic cone in the implementation, these two logic cones corresponding to each other. In addition, b1 through b6 indicate instance names, respectively.

If instances b1, b2 and b3 in the logic cone of FIG. 7A have the same identification flag, they are extracted as a subcone 31. In addition, if instances b4, b5 and b6 in the logic cone of FIG. 7A have the same the identification flag, they are extracted as a subcone 32.

Similarly, if instances b1, b2 and b3 in the logic cone of FIG. 7B have the same identification flag, they are also extracted as a subcone 33. In addition, if instances b4, b5 and b6 in the logic cone of FIG. 7B have the same the identification flag, they are extracted as a subcone 34.

As described above, a collection of instances, which are mutually connected one another and have an equal identification flag, are extracted as a subcone for each of the specification and the implementation, and corresponding subcones in the specification and the implementation are verified, respectively. In FIGS. 7A and 7B, logical equivalence between the corresponding subcones 31 and 33 is verified, and if, for example, the verification results match or coincide with each other, no display is made. Also, logical equivalence between the corresponding subcones 32 and 33 are verified, and the verification results, if not match each other for example, are displayed. As can be seen from the foregoing, only the subcones with their logic becoming not matched are displayed by the display part 3, whereby the time and trouble in analyzing the cause of mismatches can be reduced, thus making it possible to shorten the design time.

Embodiment 4

In this fourth embodiment, subcones are extracted from a logic cone while excluding prescribed portions not to be verified from the logic cone before logical equivalence verification thereof, and each of the subcones is verified, so that only those subcones for which the verification results does not match are displayed.

Though in this fourth embodiment, too, logical equivalence verification is carried out in accordance with a flow shown in FIG. 3 by using the logical equivalence verifying device illustrated in FIG. 1, the preprocessing and the subcone extraction processing in this embodiment are different from those in the first embodiment. Hereinafter, reference will be made to the preprocessing and the subcone extraction processing in this embodiment.

First of all, the portions not to be verified will be explained. The portions not to be verified include, for example, test circuits (scan circuits) used for manufacturing tests, logic changed portions due to cutting of loop circuits, etc. The portions not to be verified are usually excluded from the circuit diagram by preprocessing or an instruction from the user before logical equivalence verification.

In this embodiment, the portions not to be verified in the specification and the implementation are each provided with an external input, and each designed in advance such a manner that a prescribed value is supplied to the external input, an output point always outputs a fixed value even if any values are input to other input points. Thus, by inputting the prescribed value to an external input of each of the portions not to be verified in the specification and the implementation before logical equivalence verification, the values of the output points become equal to one another, so the extraction processing of the portions not to be verified is achieved.

Next, the subcone extraction processing in this embodiment will be described below. In this embodiment, after the preprocessing section 7 has extracted, as logic cones, portions of a circuit having verification points as output points, the subcone extracting section 8 supplies external inputs to the corresponding logic cones in the specification and the implementation so as to extract portions not to be verified (S21). The portions not to be verified are registered as subcones not to be displayed in the verification DB6. When a logic cone is not divided into a plurality of portions by the portions not to be verified (S22, No), the remainder of the logic cone is registered as a subcone in the verification DB6 (S23), and the flow is ended, whereas when a logic cone is divided into a plurality of portions by the portions not to be verified (S22, Yes), the plurality of portions thus divided are registered as subcones in the verification DB6 (S24), and the flow is ended. The subcone extraction processing according to the above-mentioned flow is performed for all the logic cones each having those portions which are desired not to be verified.

The subcone extracting section 8 extracts subcones from each logic cone according to the above-mentioned flow, and records information on the extracted subcones in the verification table of the verification DB 6 (S2). Then, processes similar to those of the first embodiment are performed for a logical equivalence verification step (S3) and an subcone indication step (S4).

FIGS. 9A and 9B are views showing one example of subcones extracted while excluding portions not to be verified. FIG. 9A shows a logic cone in the specification, and FIG. 4B shows a logic cone in the implementation, these two logic cones corresponding to each other. In addition, shaded portions are the portions not to be verified, respectively.

In the logic cone of FIG. 9A, an output point 41 for a shaded portion always outputs a fixed value by supplying a prescribed input to an external input therefor. As a result, the shaded portion can be made to be a portion not to be verified. Here, note that the logic cone of the specification is divided into two portions by extracting and extruding the portion not to be verified, so that the two portions thus divided are extracted as subcones 42 and 43.

Similarly, in the logic cone of FIG. 9B, an output point 44 for a shaded portion always outputs a fixed value by supplying a prescribed input to an external input therefor. As a result, the shaded portion can be made to be a portion not to be verified. Here, the logic cone of the implementation is divided into two portions by extracting and extruding the portion not to be verified, so that the two portions thus divided are extracted as subcones 45 and 46.

As described above, subcones are extracted by excluding the portions not to be verified, and corresponding subcones of the specification and the implementation are successively verified. In FIGS. 9A and 9B, the shaded portions are not displayed, and logical equivalence between the corresponding subcones 43 and 46 are verified, and the verification results, if not match each other for example, are displayed. Also, logical equivalence between the corresponding subcones 42 and 45 are verified, and the verification results, if not match each other for example, are displayed. As can be seen from the foregoing, only the subcones with their logic becoming mismatched or not matched are displayed by the display part 3, whereby the time and trouble in analyzing the cause of mismatches can be reduced, thus making it possible to shorten the design time. Although the portions not to be verified are not displayed in this embodiment, they may be displayed at low brightness.

It is to be noted that in the first through fourth embodiments, both the circuit diagram of the specification and the circuit diagram of the implementation are displayed by the display part 3 as verification results, but only one of these circuit diagrams may be displayed. In addition, although portions having matched verification results are not displayed in this embodiment, they may instead be displayed at low brightness.

Embodiment 5

In this fifth embodiment, in cases where a large amount of mismatched subcones, which are logically mismatched subcones, are detected as a result of logical equivalence verification between a specification and an implementation being carried out by using either of the first through fourth embodiments, an analysis of common mismatch causes is carried out to find elements for the common cause of logical mismatches in the specification and the implementation.

In designing a multistage logic circuit, by performing logical synthesis for the purpose of fabricating the circuit with the use of the least possible number of elements while commonizing or sharing these elements, it is becoming possible to design the logic circuit with its component elements being commonized or shared as much as possible. In this case, the commonized or shared elements belong to a plurality of subcones, and if there is an error even at a single location in such shared elements belonging to many subcones in an implementation, such many subcones might result in logical mismatches or non-coincidences. In other words, in cases where a plurality of logical mismatches are detected and a plurality of related portions do logically mismatch, there is a high possibility of the existence of common causes for such logical mismatches. Therefore, in this embodiment, those elements which commonly exist in the mismatched subcones are assumed as common mismatch cause candidates.

Figure 10:
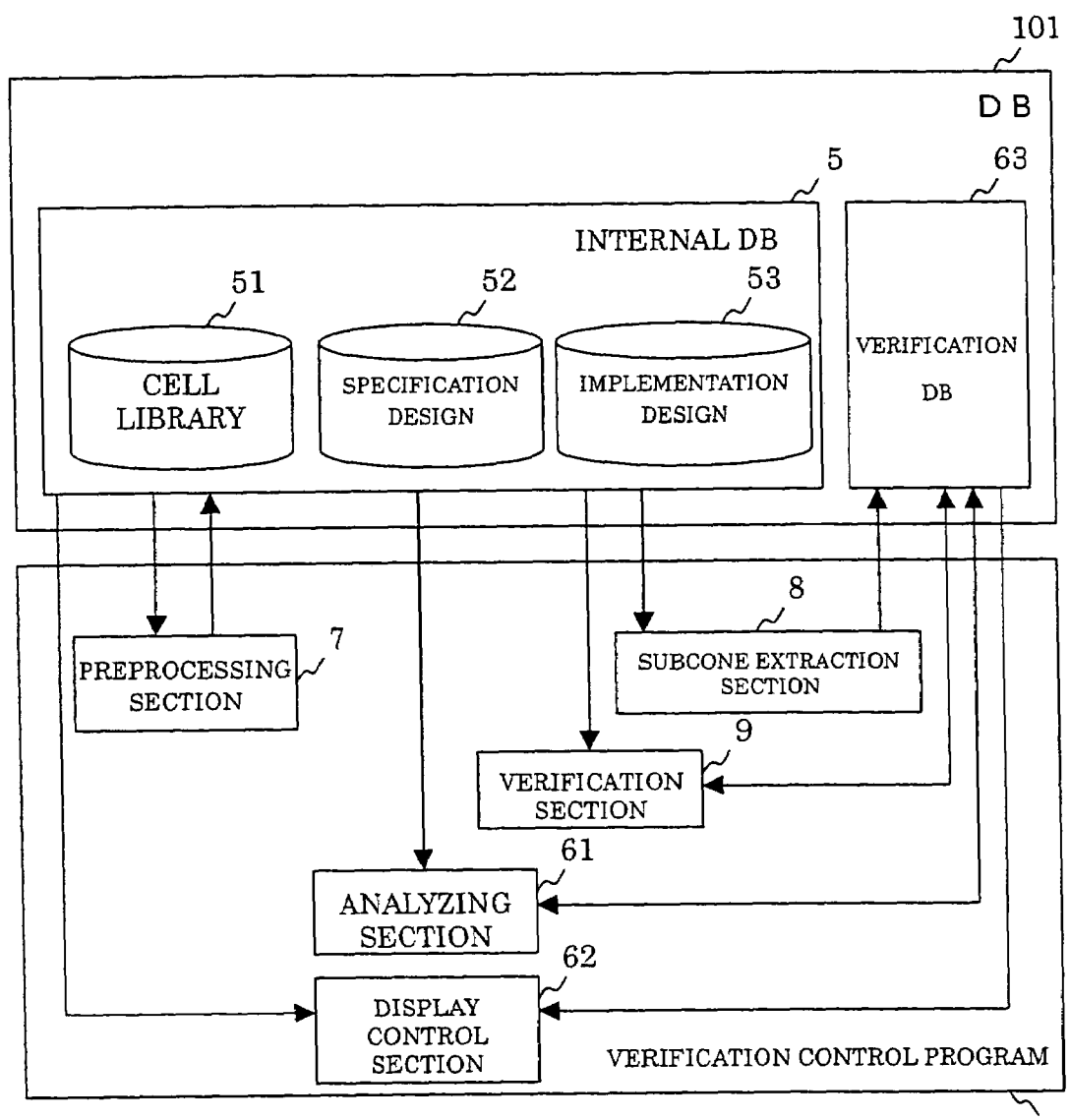
FIG. 10 is a functional block diagram showing one example of the function of a logical equivalence verifying device according to a fifth embodiment of the present invention.

First, reference will be made to the function of a logical equivalence verifying device according to this embodiment. As shown in FIG. 10, the logical equivalence verifying device of this embodiment is similar to that shown in FIG. 2 except for the following. A DB 101 and a verification control program 201 are provided in place of the DB 100 and the verification control program 200 of FIG. 2. In addition, a verification DB 63 and a display control section 62 are provided in place of the verification DB 6 and the display control section 10, and a new component in the form of an analyzing section 61 is added. The verification DB 63 is provided with an analysis table and an analysis result table in addition to a verification table. The display control section 62 has, in addition to the function of displaying mismatched subcones, the function of displaying a logical mismatch list screen, an analysis condition setting screen, a common mismatch cause analysis result screen, a mismatch cause influence analysis screen, an influence propagation range screen, and a verification constraint setting screen, all of these screens being described later. The analyzing section 61 performs a common mismatch cause analysis.

Figure 11:
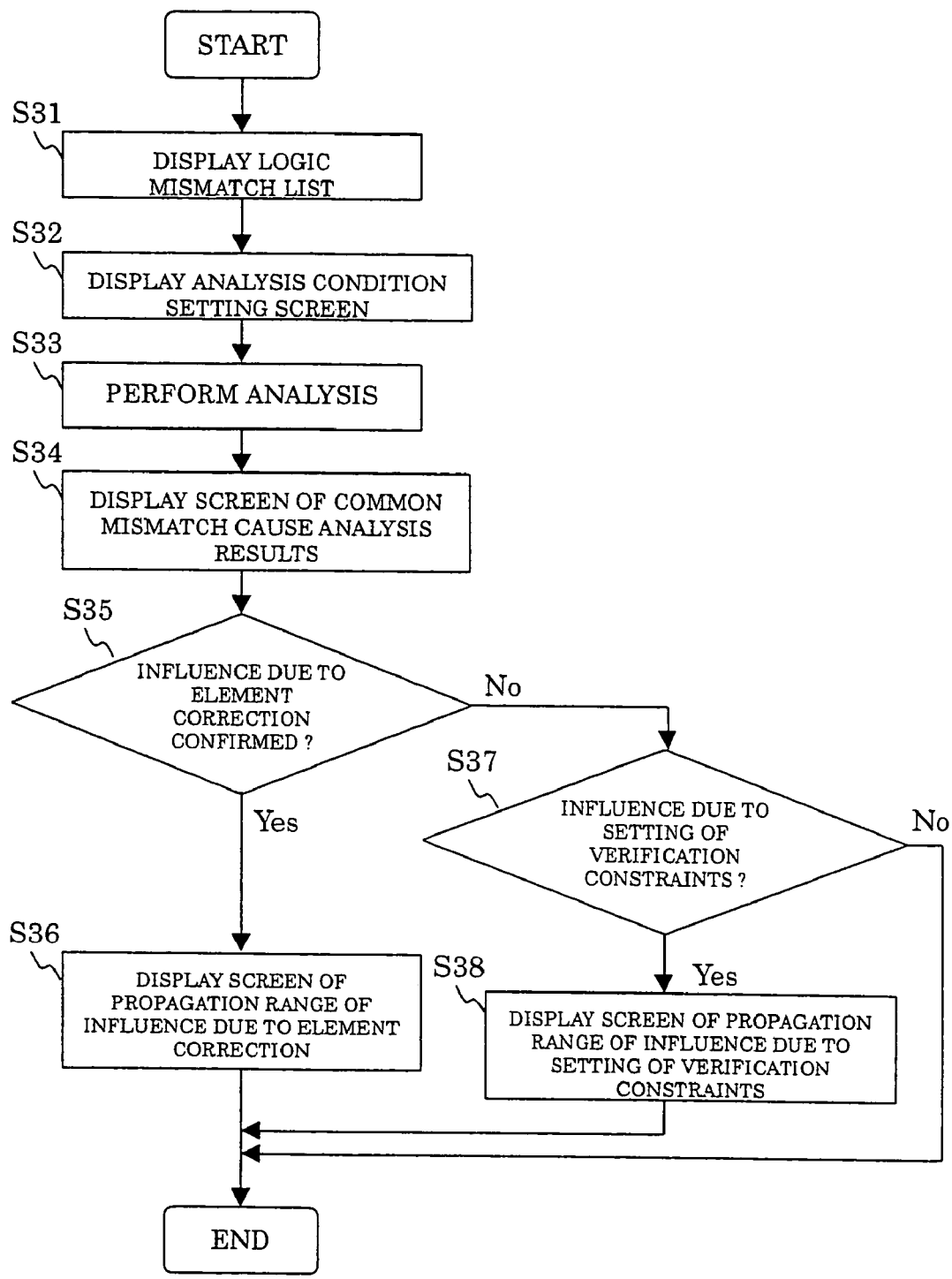
FIG. 11 is a flow chart showing one example of a common mismatch cause analysis process.
Figure 12:
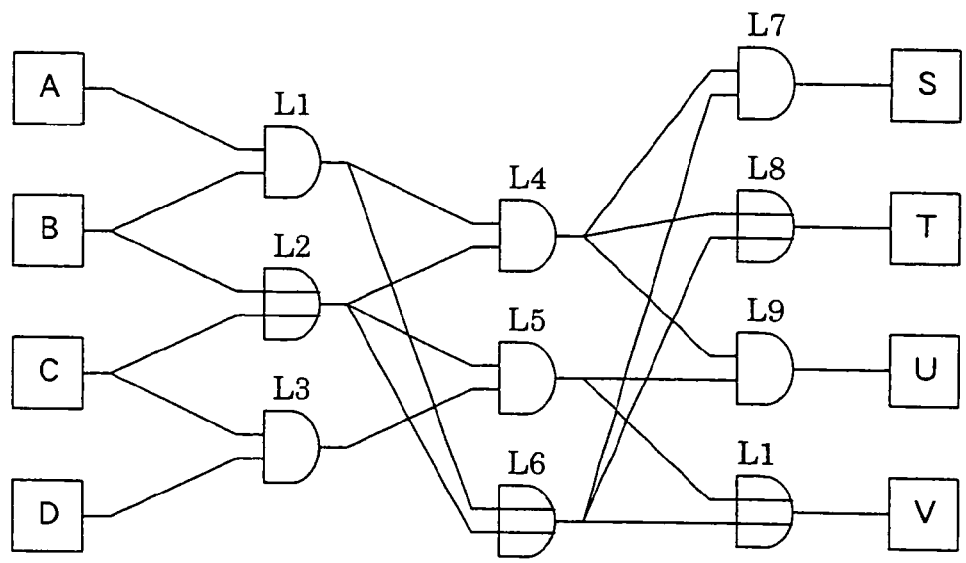
FIG. 12 is a view showing one example of a specification of a circuit.
Figure 13:
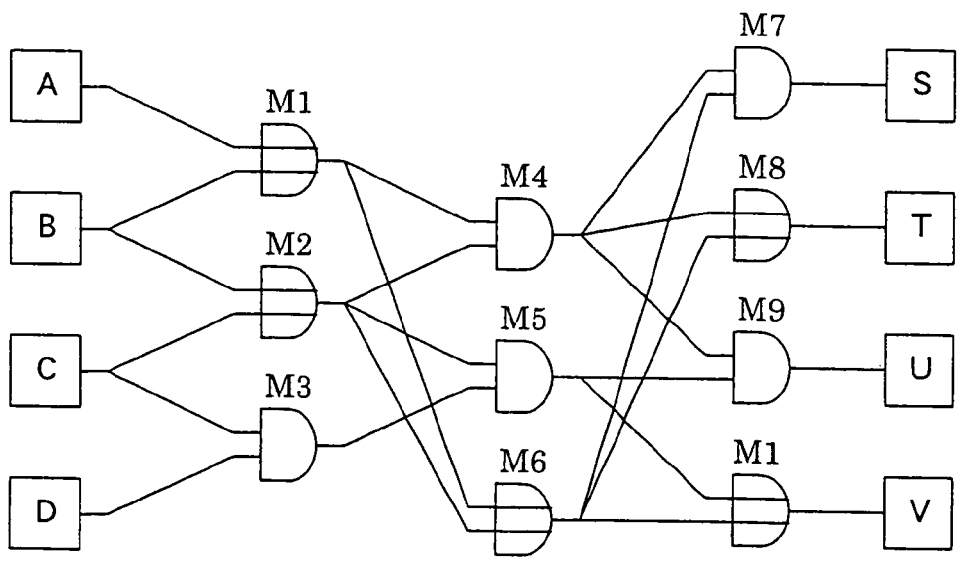
FIG. 13 is a view showing one example of an implementation of the circuit.
Figures 14, 15:
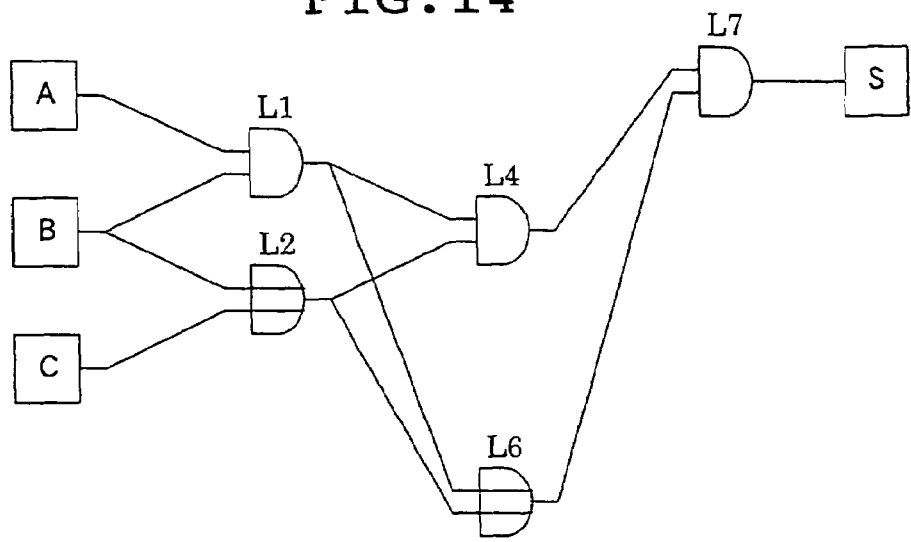
FIG. 14 is a view showing a subcone with a symbol S in a specification as an output point.
FIG. 15 is a view showing one example of a logical mismatch list screen.

Hereinafter, reference will be made to the common mismatch cause analysis by using a flow chart of FIG. 11. In this embodiment, an explanation will be made by taking, as an example, a specification and an implementation shown in FIGS. 12 and 13, respectively. The specification shown in FIG. 12 is composed of elements represented by instance names L1 through L10, respectively, and has input points A, B, C and D, and output points S, T, U and V. In addition, the implementation shown in FIG. 13 is composed of elements represented by instance names M1 through M10, respectively, and has input points A, B, C and D, and output points S, T, U and V. FIG. 14 shows a subcone having input points A, B and C, and an output point S in the specification. Subcones having output points S, T, U and V, respectively, are extracted from the specification and the implementation, respectively, as in the subcone shown in FIG. 14. Here, logical equivalence verification and common mismatch cause analysis are carried out for each subcone, but may instead be done by the use of the logic cones in place of the subcones.

First of all, the specification shown in FIG. 12 and the implementation shown in FIG. 13 are subjected to logical equivalence verification for each subcone, and subcones with mismatched verification results are displayed. In the first through fourth embodiments, the display control section 62 displays mismatched subcones on the circuit diagrams in the specification and the implementation, respectively, but in this embodiment, the outputs of the mismatched subcones are displayed as a logical mismatch list (S31).

FIG. 15 is a view that shows one example of the logical mismatch list screen. On the logical mismatch list screen, there are displayed the output points of the mismatched subcones in the specification and the implementation as a list. By checking the output points of the mismatched subcones using the input part 4, the user selects an analytical subcone on the logical mismatch list screen. An analytical subcone is a subcone to be subjected to a common mismatch cause analysis among the mismatched subcones. Here, let us assume that the user selects analytical subcones by checking off the output points S, T, U and V in the specification and the implementation, as shown in FIG. 15. For selection of analytical subcones, there may be provided such a function that all the output points or a fixed number of output points are automatically selected by preselecting, as an initial setting, the output points on the logical mismatch list screen.

When the user clicks an analysis condition setting button 71 on the logical mismatch list screen after selecting the analytical subcones, the analyzing section 61 stores the analytical subcones selected on the logical mismatch list screen in the analysis table of the verification DB 63, and the display control section 62 displays an analysis condition setting screen (S32). FIG. 16 is a view that shows one example of such an analysis condition setting screen. Here, the user sets a condition to perform a common mismatch cause analysis by using the input part 4. On the analysis status setting screen, the user can set the kinds (types) of analysis elements (gates), the connection status of analysis elements, and the number of occurrences.

With respect to the kinds of analysis elements (gates), it is possible to limit the kinds of elements to be subjected to the common mismatch cause analysis. For example, when an "AND" and an "OR" are turned on, as shown in FIG. 16, only AND elements (gates) and OR elements (gates) are made as objects to be subjected to the common mismatch cause analysis. Here, note that only the "AND" and the "OR" are turned on herein as an example, but other kinds of analysis elements (gates) may be selected.

In the analysis element connection status, the user can limit the connection status of elements to be subjected to the common mismatch cause analysis. A minimum input number indicates the minimum number of inputs to an element, a maximum input number indicates the maximum number of inputs to an element, a minimum output branch number indicates the minimum number of branch outputs of an element, and a maximum output branch number indicates the maximum number of branch outputs of an element. Assuming, for example, that the minimum input number is 2, and the maximum input number, the minimum output branch number and the maximum branch output number are not limited, as shown in FIG. 16, only elements with 2 or more inputs become objects to be subjected to the common mismatch cause analysis.

In the number of occurrences, it is possible to limit the status of occurrences of the elements to be subjected to the common mismatch cause analysis. If, for example, the number of occurrences is limited to 1 or more, as shown in FIG. 16, only the elements having occurred one or more times becomes the objects to be subjected to the common mismatch cause analysis.

Here, it is assumed that the user has set an analysis condition as shown in FIG. 16. When the user clicks an analysis execution button 72 on an analysis condition setting screen after having set the analysis condition, the analyzing section 61 stores the analysis condition thus set on the analysis condition setting screen in the analysis table of the verification DB 63. Then, the analyzing section 61 performs the common mismatch cause analysis by using information on analytical subcones and their analysis condition in the DB 101 (S33).

Here, the common mismatch cause analysis will be described below. First, the analyzing section 61 extracts analysis elements which are the elements meeting the analysis condition among elements constituting an analytical subcone in each of the specification and the implementation. Then, by comparing each analysis element with elements constituting each mismatched subcone, pertinent subcones, which are the mismatched subcones including the analysis elements, are extracted, and a pertinent number, which is the number of pertinent subcones, is calculated. Thereafter, the analysis elements each associated with its pertinent subcones and its pertinent number are stored in the analysis result table.

Subsequently, the display control section 62 displays the common mismatch cause analysis result screen according to the analysis result table (S34). FIG. 17 is a view that shows one example of the common mismatch cause analysis result screen. As shown in FIG. 17, on the common mismatch cause analysis result screen, there are displayed, as matrix form, line labels comprising instance names of analysis elements, and row labels comprising output point names of mismatched subcones, with check marks being attached at locations of each analysis element corresponding to pertinent subcones, together with a pertinent number for each analysis element.

Here, in the common mismatch cause analysis result of the specification shown in FIG. 17, those analysis elements, among the elements constituting the analytical subcones, which meet an analysis condition that kinds of elements are AND gates or OR gates having 2 or more inputs with the number of occurrences being 1 or more, are L1 through L10, so the analysis elements L1 through L10 are displayed as line labels. For example, a mismatched subcone represented by an output point S includes L1, L2, L4, L6 and L7, and hence check marks are displayed as attached at the locations of the lines corresponding to the analysis elements L1, L2, L4, L6 and L7 in the row corresponding to the output point S. Similarly, check marks are displayed at the positions corresponding to all the analysis elements and their pertinent subcones, and the pertinent number of the analysis element L1 is further displayed as 4.

Moreover, the lower limit of the pertinent number may be designated so that only analysis elements common to logically mismatched subcones equal in number to, or more than, the lower limit can be displayed. As a result, the user can easily inspect the situation in cases where there are a lot of analysis elements. Although analysis elements are displayed herein in the numerical order thereof, they may be displayed in the increasing order of the pertinent numbers. By inspecting such a common mismatch cause analysis result screen, the user can determine that analysis elements with larger pertinent numbers are common mismatch cause candidates with a high possibility of being the cause of common mismatches.

Then, the user reverifies the common mismatch cause candidates by correcting the elements thereof or setting verification constraints thereon. Here, note that unnecessary circuit changes and reverifications can be reduced by displaying how much a circuit change due to a correction of the elements or setting of verification constraints influences the mismatched subcones in the last logical equivalence verification.

When the user desires the influence due to the correction of the elements to be displayed on the common mismatch cause analysis result screen (S35, Yes), the display control section 62 displays the range of influence propagation accompanying the correction of the elements (S36), and the flow is then ended. Also, when the user desires the influence due to the setting of the verification constraints to be displayed (S37, Yes), the display control section 62 displays the range of influence propagation accompanying the verification constraints (S38), whereafter the flow is ended. In addition, when the user does not desire the influence due to the correction of the elements and the setting of the verification constraints (S37, No), the flow is immediately ended.

Figure 18:
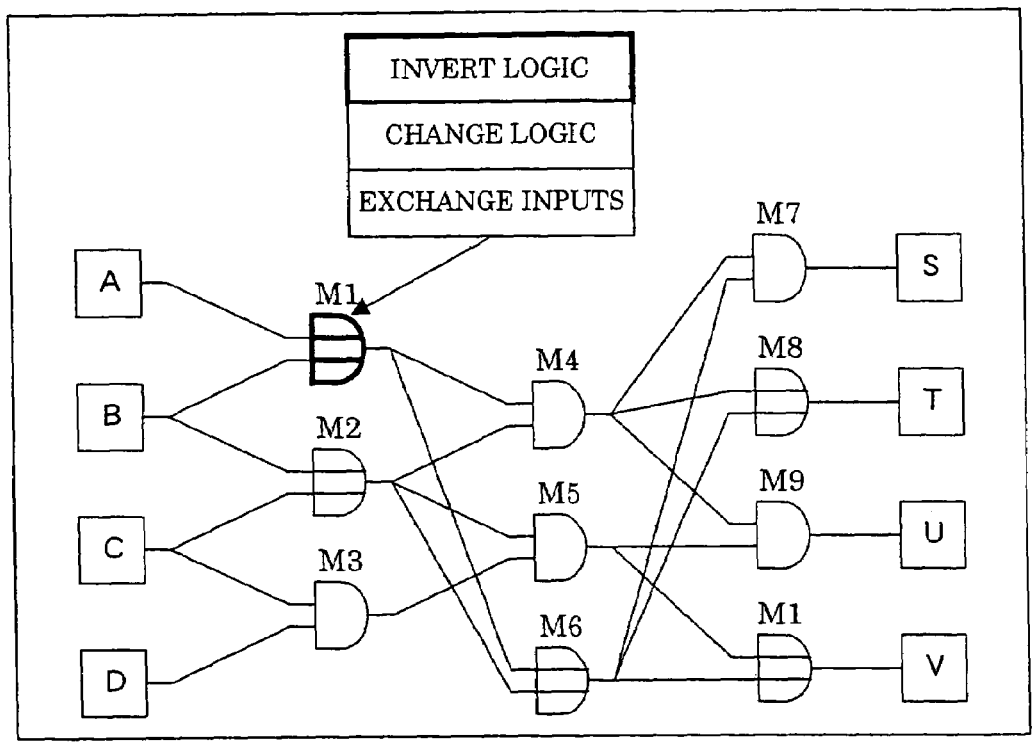
FIG. 18 is a view showing one example of a mismatch cause influence analysis screen.

Here, the display of the influence propagation range accompanying the change of the elements will be described below. When the user double-clicks an element M1 for example in FIG. 17 to select it as a common mismatch cause candidate after inspecting the common mismatch cause analysis result screen, the display control section 62 displays a mismatch cause analysis screen, as shown in FIG. 18. In an example of FIG. 18, a circuit diagram is displayed on the mismatch cause analysis screen with the element M1 therein being highlighted. Further, when the user clicks the element M1 to select it, the statements "INVERT LOGIC", "CHANGE LOGIC", and "EXCHANGE INPUTS" are displayed in pop-up windows as element correction method candidates.

Figure 19:
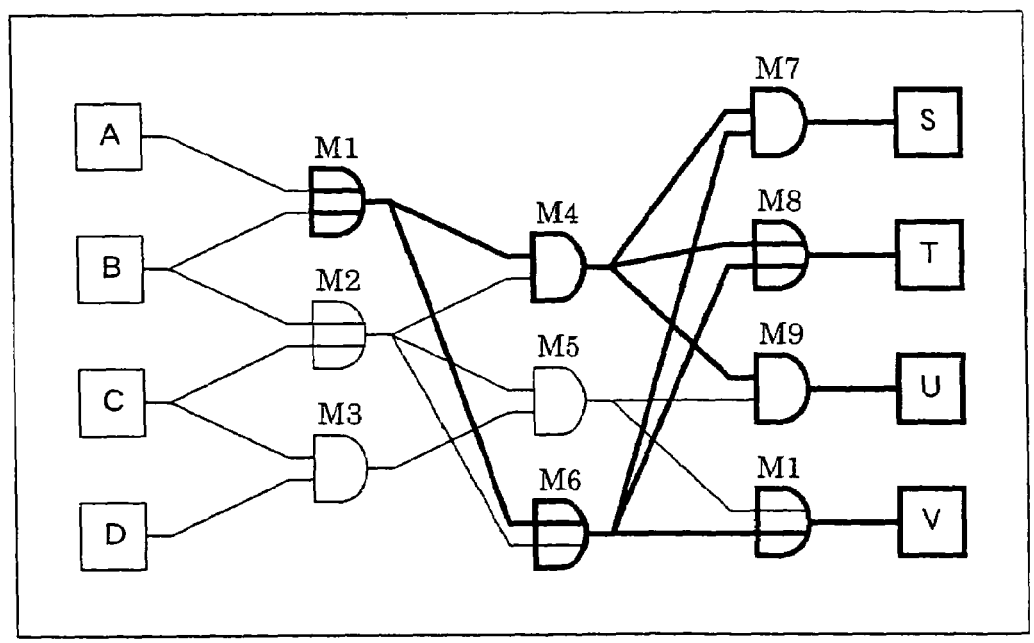
FIG. 19 is a view showing one example of an influence propagation range screen.

Thereafter, when the user selects "INVERT LOGIC" for example from among the correction method candidates, the display control section 62 displays an influence propagation range screen, as shown in FIG. 19, and a circuit diagram is displayed on the influence propagation range screen with a range where the influence due to the selected correction reaches being highlighted. An example of FIG. 19 illustrates that the influence due to the logical inversion of the element M1 is exerted upon output points S, T, U and V and instances M4, M6, M7, M8, M9 and M10. In addition, those output points which are influenced by the logical inversion of the element M1 may be highlighted on the logical mismatch list screen.

From the influence propagation range screen of FIG. 19, the user can know the presence of influence on the output points S, T, U and V due to the correction of the element M1, and understand the meaning of reverification. Also, it will be understood that if the influence due to the logical inversion of the element M1 does not propagate to either of the output points S, T, U and V on the influence propagation range screen. The user need not correct the element M1, and only has to investigate other common mismatch cause candidates.

Figure 20:
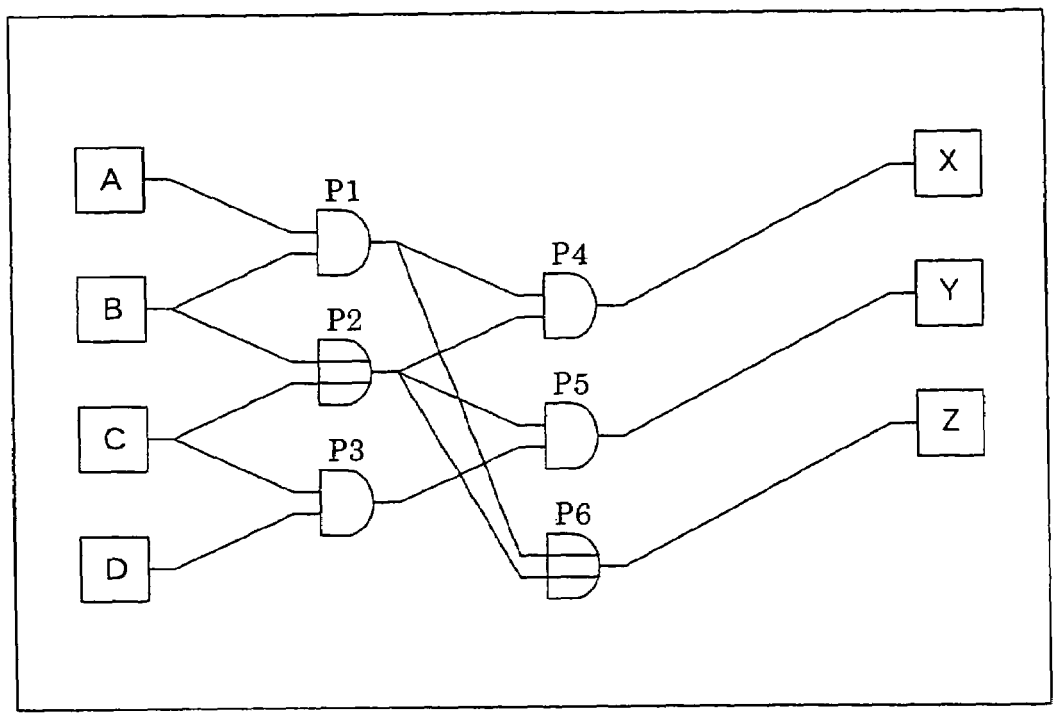
FIG. 20 is a view showing another example of a specification of a circuit.
Figure 21:
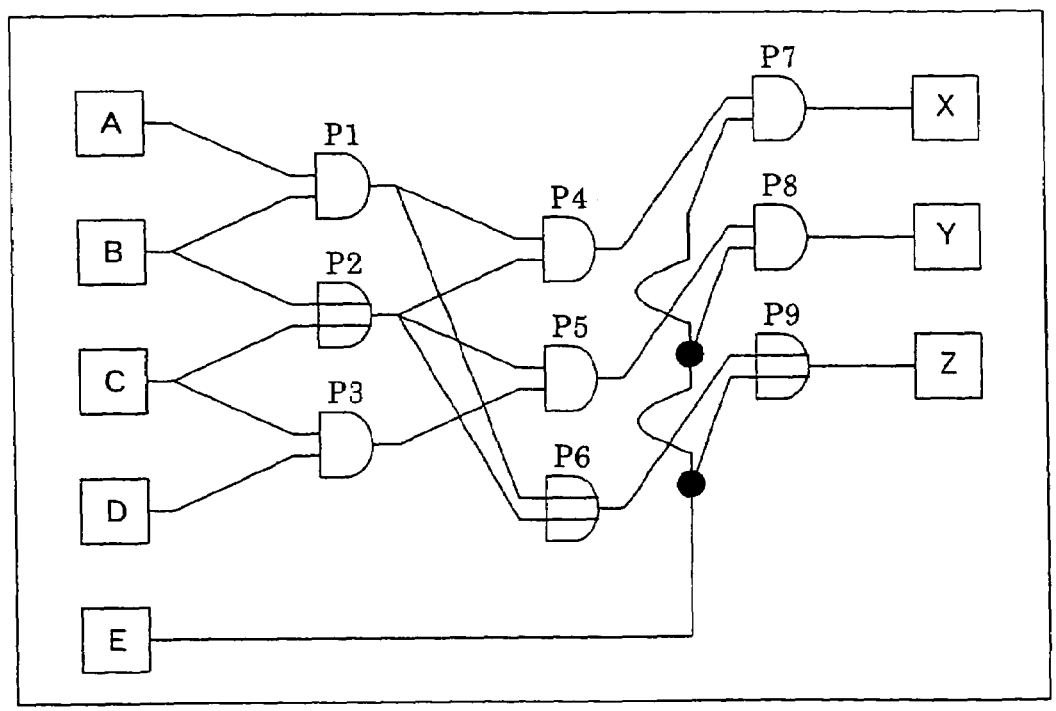
FIG. 21 is a view showing another example of an implementation of the circuit of FIG. 20.

Subsequently, the display of the influence propagation range accompanying the setting of the verification constraints will be described below. When the user inputs an instruction to display a verification constraint setting screen after inspecting the common mismatch cause analysis result, the display control section 62 displays the verification constraint setting screen (not shown). What is the setting of verification constraints means that when a portion to be excluded from verification, such as a test circuit or the like, is added to only one of the specification circuit and the implementation circuit, the portion to be excluded from verification is excluded or removed by setting an input of that portion to a fixed value. For example, let us assume that when the specification shown in FIG. 20 and the implementation shown in the FIG. 21 are subjected to logical equivalence verification, output points X, Y and Z become logically mismatched, and an input E, which is a cause of logical mismatch, is added as a test circuit. In this case, the input E is set to a high level as a verification constraint in order to cause this test circuit not to operate or function.

Figure 22:
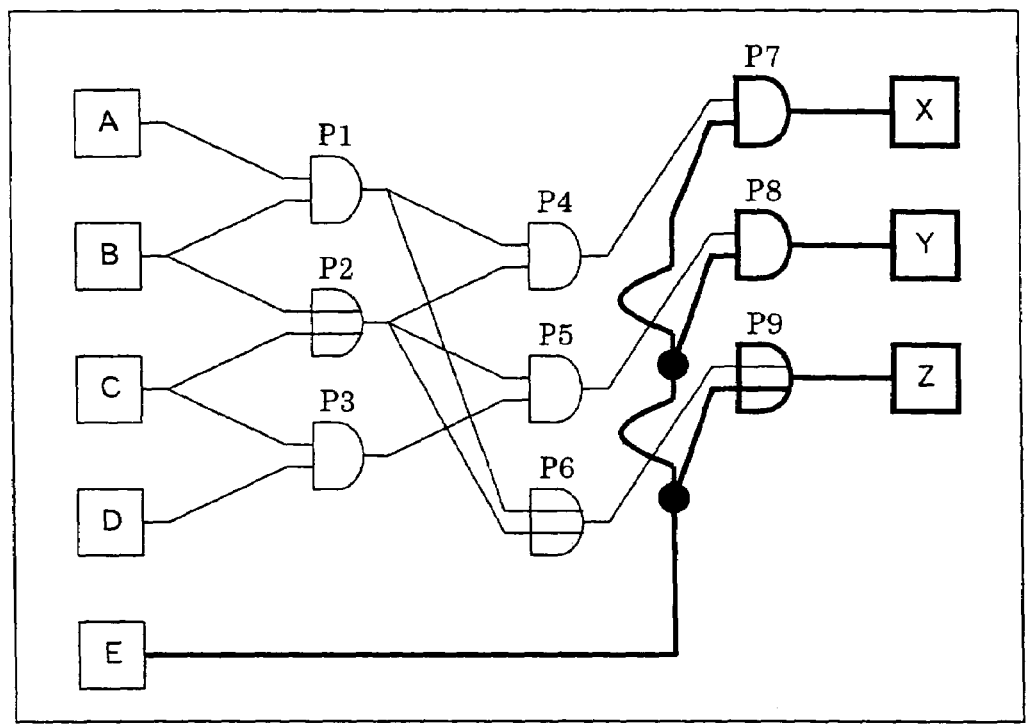
FIG. 22 is a view showing another example of an influence propagation range screen.
Figure 23:
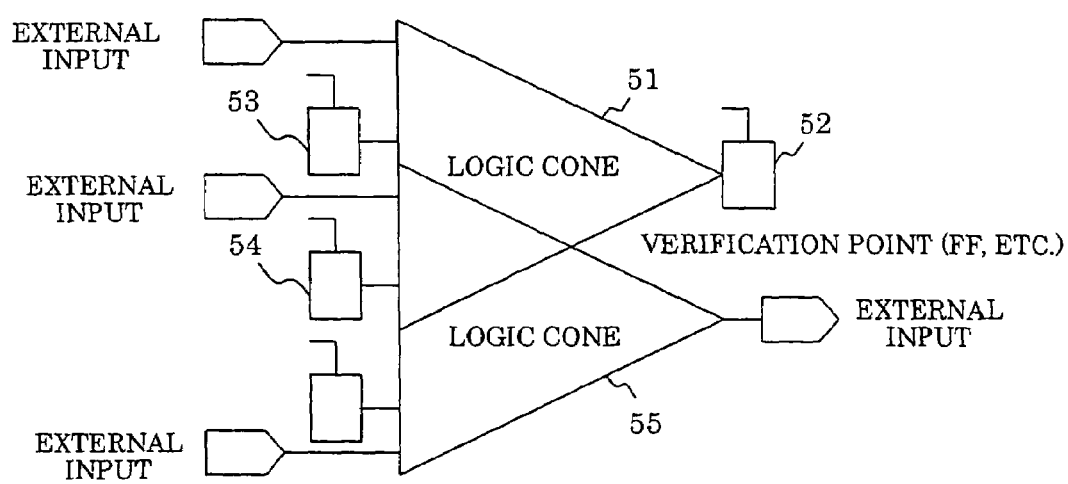
FIG. 23 is a view showing examples of conventional logic cones.

The verification constraint setting screen is provided with setting items for verification constraints and an influence verification button. When the user clicks the influence verification button in an example of FIG. 21 after setting the input E to a high level in an setting item of the verification constraints, the display control section 62 displays an influence propagation range screen, as shown in FIG. 22, and a circuit diagram is displayed on the influence propagation range screen with a range where the influence due to the setting of the verification constraint reaches being highlighted. An example of FIG. 22 illustrates that the influence due to the input E is exerted upon elements P7, P8 and P9 and output points X, Y and Z. In addition, those output points which are influenced by the input E may be highlighted on the logical mismatch list screen shown in FIG. 15.

From the influence propagation range screen of FIG. 22, the user can know that there are influences on the output point X, Y and Z due to the setting of the verification constraint, and understand the meaning of reverification. Also, it will be understood that if the influence due to the setting of the verification constraint does not propagate to either of the output points X, Y and Z on the influence propagation range screen. The user need not set the verification constraint, and only has to investigate other common mismatch cause candidates.

As described in detail in the foregoing, according to the present invention, by performing logical equivalence verification for each subcone to display only those subcones which contain a cause of mismatch, it is possible to reduce the time and trouble of analyzing the cause of mismatches that should be performed by the user, thereby enabling the design and verification TAT to be shortened. In addition, when a multitude of logically mismatched subcones appear or occur, a plurality of logical mismatches can be analyzed at the same time, and hence it becomes easy to analyze the cause of common mismatches. Accordingly, the time of analysis is greatly shortened in comparison with a method of analyzing all logically mismatched subcones one by one. Moreover, by taking the commonness of the cause of logical mismatches into consideration, it is possible to prevent an increase in the portions to be corrected as well as the generation of other new or additional causes of mismatches, thus making it possible to optimize the correction.

While the invention has been described in terms of preferred embodiments, those skilled in the art will recognize that the invention can be practiced with modifications within the spirit and scope of the appended claims.

What is claimed is:

1. A logical equivalence verifying device for performing logical equivalence verification of two prescribed circuits to display results thereof, said logical equivalence verifying device comprising:

a identifier recording section that performs instance name matching for each element in which it is determined whether instance names of elements in corresponding logic cones of said two prescribed circuits match each other, and records the results of said instance name matching as identifiers, respectively;

a subcone extracting section that extracts a plurality of element collections as subcones from each of said logic cones, each element collection including elements which are connected with each other and have the same identifier;

a verifying section that verifies logical equivalence between said two prescribed circuits for each subcone extracted by said subcone extracting section; and a display control section that displays a first group of subcones with mismatched results of said logical equivalence verification and a second group of subcones with matched results of said logical equivalence verification while distinguishing between these first and second groups of subcones based on the results of said logical equivalence verification.

2. A logical equivalence verifying device for performing logical equivalence verification of two prescribed circuits to display results thereof, said logical equivalence verifying device comprising:

a subcone extracting section that extracts subcones from corresponding logic cones of said two prescribed circuits by excluding prescribed portions of said logic cones by providing an external input to each of said prescribed portions to make their outputs to be at a constant value;

a verifying section that verifies logical equivalence between said two prescribed circuits for each subcone extracted by said subcone extracting section; and a display control section that displays a first group of subcones with mismatched results of said logical equivalence verification and a second group of subcones with matched results of said logical equivalence verification while distinguishing between these first and second groups of subcones based on the results of said logical equivalence verification.

3. The logical equivalence verifying device according to claim 2, wherein when said logic cone is divided into a plurality of portions by said prescribed portions, said subcone extracting section extracts said plurality of portions as subcones.

4. A logical equivalence verifying device for performing logical equivalence verification of two prescribed circuits to display results thereof, said logical equivalence verifying device comprising:

an internal verification point associating section that selects internal verification points in corresponding logic cones of said two prescribed circuits, respectively, to observe outputs of portions thereof, and associates said internal verification points of one of said two prescribed circuits with those of the other circuit;

a subcone extracting section that extracts subcones from said logic cones by using said internal verification points;

a verifying section that verifies logical equivalence between said two prescribed circuits for each subcone extracted by said subcone extracting section; and a display control section that displays a first group of subcones with mismatched results of said logical equivalence verification and a second group of subcones with matched results of said logical equivalence verification while distinguishing between these first and second groups of subcones based on the results of said logical equivalence verification.

5. A logical equivalence verifying device for analyzing causes of logical mismatch when a plurality of mismatched logic cones are detected which are logically mismatched logic cones as a result of logical equivalence verification between two prescribed circuits, said logical equivalence verifying device comprising:

a storage section that stores elements constituting said logicall mismatched logic cones;

an analyzing section that extracts, as analysis elements among said logically mismatched logic cones, those elements which constitute logic cones that have been selected as objects for analysis, further extracts, as pertinent logic cones, said logically mismatched logic cones including said analysis elements for each of said analysis elements, and calculates a number of said pertinent logic cones as a pertinent number for each of said analysis elements; and a display control section that displays said pertinent number for each of said analysis elements.

6. The logical equivalence verifying device according to claim 5, wherein said display control section displays only those of said analysis elements for which said pertinent number is within a prescribed range.

7. The logical equivalence verifying device according to claim 5, wherein said display control section further displays an identifier of each of said pertinent logic cones for each of said analysis elements.

8. The logical equivalence verifying device according to claim 5, wherein said display control section highlights those output points which are subject to influences due to a correction of elements.

9. The logical equivalence verifying device according to claim 5, wherein said display control section highlights those output points which are subject to influences due to a constraint of an input for excluding a prescribed portion not to be verified.

10. A logical equivalence verifying method for performing logical equivalence verification of two prescribed circuits to display results thereof, said logical equivalence verifying method comprising:

a step for performing instance name matching for each element in which it is determined whether instance names of elements in corresponding logic cones of said two prescribed circuits match each other, and recording the results of said instance name matching as identifiers, respectively;

a step for extracting a plurality of element collections as subcones from each of said logic cones, each element collection including elements which are connected with each other and have the same identifier;

a step for performing logical equivalence verification between said two prescribed circuits for each of said subcones; and a step for displaying a first group of subcones with mismatched results of said logical equivalence verification and a second group of subcones with matched results of said logical equivalence verification while distinguishing between these first and second groups of subcones based on the results of said logical equivalence verification.

11. A logical equivalence verifying method for performing logical equivalence verification of two prescribed circuits to display results thereof, said logical equivalence verifying method comprising:

a step for extracting subcones from corresponding logic cones of said two prescribed circuits by excluding prescribed portions of said logic cones by providing an external input to each of said prescribed portions to make their outputs to be at a constant value;

a step for performing logical equivalence verification between said two prescribed circuits for each of said subcones; and a step for displaying a first group of subcones with mismatched results of said logical equivalence verification and a second group of subcones with matched results of said logical equivalence verification while distinguishing between these first and second groups of subcones based on the results of said logical equivalence verification.

12. A logical equivalence verifying method for performing logical equivalence verification of two prescribed circuits to display results thereof, said logical equivalence verifying method comprising:

a step for selecting internal verification points in corresponding logic cones of said two prescribed circuits, respectively, to observe outputs of portions thereof, and associating said internal verification points of one of said two prescribed circuits with those of the other circuit;

a step for extracting subcones from said logic cones by using said internal verification points;

a step for performing logical equivalence verification between said two prescribed circuits for each of said subcones; and a step for displaying a first group of subcones with mismatched results of said logical equivalence verification and a second group of subcones with matched results of said logical equivalence verification while distinguishing between these first and second groups of subcones based on the results of said logical equivalence verification.

13. A logical equivalence verifying method for analyzing causes of logical mismatch when a plurality of mismatched logic cones are detected which are logically mismatched logic cones as a result of logical equivalence verification between two prescribed circuits, said logical equivalence verifying method comprising:

a step for storing elements constituting said logically mismatched logic cones;

a step for extracting, as analysis elements among said logically mismatched logic cones, those elements which constitute logic cones that have been selected as objects for analysis, further extracting, as pertinent logic cones, said logically mismatched logic cones including said analysis elements for each of said analysis elements, and calculating a number of said pertinent logic cones as a pertinent number for each of said analysis elements; and a step for displaying said pertinent number for each of said analysis elements.

14. A logical equivalence verifying program for causing a computer to execute a logical equivalence verifying method which performs logical equivalence verification of two prescribed circuits to display results thereof, said logical equivalence verifying program adapted to make said computer execute steps of:
- performing instance name matching for each element in which it is determined whether instance names of elements in corresponding logic cones of said two prescribed circuits match each other, and recording the results of said instance name matching as identifiers, respectively;
- extracting a plurality of element collections as subcones from each of said logic cones, each element collection including elements which are connected with each other and have the same identifier;
- performing logical equivalence verification between said two prescribed circuits for each of said subcones; and
- displaying a first group of subcones with mismatched results of said logical equivalence verification and a second group of subcones with matched results of said logical equivalence verification while distinguishing between these first and second groups of subcones based on the results of said logical equivalence verification.

15. A logical equivalence verifying program for making a computer execute a logical equivalence verifying method which performs logical equivalence verification of two prescribed circuits to display results thereof, said logical equivalence verifying program adapted to make said computer execute steps of:
- extracting subcones from corresponding logic cones of said two prescribed circuits by excluding prescribed portions of said logic cones by providing an external input to each of said prescribed portions to make their outputs to be at a constant value;
- performing logical equivalence verification between said two prescribed circuits for each of said subcones; and
- displaying a first group of subcones with mismatched results of said logical equivalence verification and a second group of subcones with matched results of said logical equivalence verification while distinguishing between these first and second groups of subcones based on the results of said logical equivalence verification.

16. A logical equivalence verifying program for making a computer execute a logical equivalence verifying method which performs logical equivalence verification of two prescribed circuits to display results thereof, said logical equivalence verifying program adapted to make said computer execute steps of:
- selecting internal verification points in corresponding logic cones of said two prescribed circuits, respectively, to observe outputs of portions thereof, and associating said internal verification points of one of said two prescribed circuits with those of the other circuit;
- extracting subcones from said logic cones by using said internal verification points;
- performing logical equivalence verification between said two prescribed circuits for each of said subcones; and
- displaying a first group of subcones with mismatched results of said logical equivalence verification and a second group of subcones with matched results of said logical equivalence verification while distinguishing between these first and second groups of subcones based on the results of said logical equivalence verification.

17. A logical equivalence verifying program for causing a computer to execute a logical equivalence verifying method for analyzing causes of logical mismatch when a plurality of mismatched logic cones are detected which are logically mismatched logic cones as a result of logical equivalence verification between two prescribed circuits, said logical equivalence verifying program adapted to make said computer execute steps of:
- storing elements constituting said logically mismatched logic cones;
- extracting, as analysis elements among said logically mismatched logic cones, those elements which constitute logic cones that have been selected as objects for analysis, further extracting, as pertinent logic cones, said logically mismatched logic cones including said analysis elements for each of said analysis elements, and calculating a number of said pertinent logic cones as a pertinent number for each of said analysis elements; and
- displaying said pertinent number for each of said analysis elements.

* * * * *

UNITED STATES PATENT AND TRADEMARK OFFICE
CERTIFICATE OF CORRECTION

| | |
|---|---|
| PATENT NO. | : 7,337,414 B2 |
| APPLICATION NO. | : 11/398609 |
| DATED | : February 26, 2008 |
| INVENTOR(S) | : Terunobu Maruyama et al. |

It is certified that error appears in the above-identified patent and that said Letters Patent is hereby corrected as shown below:

Column 23, Line 21, change "logicall" to --logically--.

Signed and Sealed this

Twenty-ninth Day of July, 2008

JON W. DUDAS
*Director of the United States Patent and Trademark Office*